United States Patent
Meany

(10) Patent No.: US 8,509,555 B2
(45) Date of Patent: Aug. 13, 2013

(54) ERROR-RESILIENT ENTROPY CODING FOR PARTIAL EMBEDDING AND FINE GRAIN SCALABILITY

(75) Inventor: James J. Meany, Des Peres, MO (US)

(73) Assignee: The Boeing Company, Chicago, IL (US)

(*) Notice: Subject to any disclaimer, the term of this patent is extended or adjusted under 35 U.S.C. 154(b) by 1189 days.

(21) Appl. No.: 12/047,061

(22) Filed: Mar. 12, 2008

(65) Prior Publication Data

US 2009/0232408 A1 Sep. 17, 2009

(51) Int. Cl.
*G06K 9/36* (2006.01)

(52) U.S. Cl.
USPC .......................................................... 382/246

(58) Field of Classification Search
USPC ................. 382/232–251; 358/426.1–426.16; 375/240.01–240.29
See application file for complete search history.

(56) References Cited

U.S. PATENT DOCUMENTS

| | | | |
|---|---|---|---|
| 4,817,182 A | 3/1989 | Adelson et al. | |
| 5,014,134 A | 5/1991 | Lawton et al. | |
| 5,315,670 A | 5/1994 | Shapiro | |
| 5,751,860 A * | 5/1998 | Su et al. | 382/244 |
| 5,850,482 A | 12/1998 | Meany et al. | |
| 5,880,856 A * | 3/1999 | Ferriere | 358/426.11 |
| 6,263,109 B1 * | 7/2001 | Ordentlich et al. | 382/232 |
| 6,711,295 B2 * | 3/2004 | Nakayama et al. | 382/232 |
| 6,847,735 B2 * | 1/2005 | Kajiwara et al. | 382/233 |
| 6,909,811 B1 * | 6/2005 | Kajiwara et al. | 382/246 |
| 2007/0036443 A1 | 2/2007 | Srinivasan | |

FOREIGN PATENT DOCUMENTS

| | | |
|---|---|---|
| EP | 0940994 A2 | 9/1999 |
| WO | WO 03/065709 A1 | 8/2003 |

OTHER PUBLICATIONS

PCT Notification of Transmittal and International Search Report for PCT/US2009/034070 dated Jul. 21, 2009.
PCT Written Opinion for PCT/US2009/034070 dated Jul. 21, 2009.
Vass J. et al., *Scalable, Highly Efficient, and Error Resilient Image Transmission By Using Joint Source-Channel Coding Strategies*, Image Processing, 2000. Proceedings, International Conference on Sep. 10-13, 2000, Piscataway, NJ, USA, IEEE, vol. 1, Sep. 10, 2000, pp. 387-390.
Chan-Soo Swang and Yungsoo Kim, *An Adaptive Modulation Method for Multicast Communications of Hierarchical Data in Wireless Networks*, Proceedings of IEEE International Conference on Communications, Apr. 28-May 2, 2002, New York, NY, IEEE, Piscataway, NJ, vol. 2, pp. 896-900.

(Continued)

*Primary Examiner* — Ishrat I Sherali
(74) *Attorney, Agent, or Firm* — Alston & Bird LLP

(57) ABSTRACT

Methods, apparatus and computer program products are provided that generate a plurality of code words representative of data to be encoded. The code words may be generated to have first and second portions with each first portion including information that is representative of a predetermined characteristic of an associated second portion and each second portion including information that is representative of a respective portion of the data. A plurality of blocks may also be defined with each block including one or more bitplanes of the second portions of the code words. The plurality of blocks may be sequenced to achieve progressive representations of the encoded content in accordance with schemes to order the data according to priority of content. Content may be provided a level of error protection commiserate with its priority.

20 Claims, 9 Drawing Sheets

(56) References Cited

OTHER PUBLICATIONS

Shiwen Mao et al., *Reliable Transmission of Video Over Ad-hoc Networks Using Automatic Repeat Request and Multi-path Transport*, VTC Fall 2001, IEEE 54th, Vehicular Technology Conference Proceedings, Atlantic City, NJ, Oct. 7-11, 2011, New York, NY, IEEE US vol. 2, Oct. 7, 2001, pp. 615-619.

Annex to Form PCT/ISA206, Communication relating to the Results of the Partial International Search for PCT/US2009/034070, dated May 15, 2009.

J.M. Shapiro; "Embedded Image Coding Using Zerotrees of Wavelet Coefficients"; IEEE Transactions on Signal Processing; vol. 41, pp. 3445-3462, 1993.

A. Said; W. Pearlman; "Reversible Image Compression via Multiresolution Representation and Predictive Coding"; Visual Communications and Image Processing; vol. 2094; pp. 664-674; SPIE, 1993.

A. Zandi, J.D. Allen, E.L. Schwartz, M. Boliek; "CREW: Compression with Reversible Embedded Wavelets"; Preprint, Ricoh California Research Center, Menlo Park, CA, 1995.

C.D. Creusere; "Fast Embedded Compression for Video"; IEEE Transactions on Image Processing; vol. 8; pp. 1811-1816; Dec. 1999.

D.A. Huffman; "A Method for the Construction of Minimum Redundancy Codes"; Proceedings of the IRE; vol. 40, No. 10, pp. 1098-1101; 1952.

J. Rissanen; "Generalized Kraft Inequality and Arithmetic Coding"; IBM Journal of Research and Development; vol. 20, 1976.

I.H. Witten, R.M. Neal and J.G. Cleary; "Arithmetic Coding for Data Compression"; Communications of the ACM; vol. 30, No. 6; pp. 520-540; Jun. 1987.

N. Tanabe and N. Farvardin; "Subband Image Coding Using Entropy-Coded Quantization Over Noisy Channels"; Computer Science Technical Report Series; UMIACS-TR-89-86; University of Maryland, College Park, MD, Aug. 1989, (Republished in IEEE Journal on Selected Areas in Communications, vol. 10, pp. 926-942, Jun. 1992.

K.A. Birney and T.R. Fischer; "On the Modeling of DCT and Subband Image Data for Compression"; IEEE Transactions on Image Processing; vol. 4; pp. 186-193; 1995.

E.R. Fiala and D.H. Greene; "Data Compression with Finite Windows"; Communications of the ACM; vol. 32; No. 4; pp. 490-505, 1989.

HD Photo Website; Downloaded from http://www.microsoft.com/en-us/download/details.aspx?id=1915 on Oct. 15, 2012.

HD Photo Feature Specification 1.0; Copyright 2006-2006 Microsoft Corporation; pp. 1-37.

"Microsoft Announces HD Photo, a New Imaging File Format with Advanced Features for Today's Digital Photographers"; Dated Mar. 8, 2007.

Press Release, 42$^{nd}$ Meeting—Lausanne, CH; "JPEG 2000 Digital Cinema Successes and Proposed Standardization of JPEG XR"; Dated Jul. 6, 2007.

"Microsoft's HD Photo Technology is Considered for Standardization by JPEG"; Dated Jul. 31, 2007.

Bill Crow; "Windows Media Photo, A New Format for End-to-End Digital Imaging"; Microsoft Corporation; © 2006 Microsoft Corporation.

Entropy Encoding—Wikipedia, the free encyclopedia; Downloaded from http://en.wikipedia.org/wiki/Entropy_encoding: on Nov. 1, 2012.

Cohen, A., *Biorthogonal Wavelets*, Wavelets—A Tutorial in Theory and Applications, C. K. Chui (ed.) (1992), 123-152.

Daubechies, I. et al., *Factoring Wavelet Transforms into Lifting Steps*, Journal of Fourier Analysis Applications, Proc. SPIE 2569, (1995) 68-79.

Golomb, S. W., *Run-Length Encodings*, IEEE Transactions Information Theory, vol. 12, No. 3, (Jul. 1966) 399-401.

Hilton, M. L. et al., *Compressing Still and Moving Images with Wavelets*, Multimedia Systems, vol. 2, No. 3 (1994), 1-19.

Jawerth, B. et al., *An Overview of Wavelet-Based Multi-Resolution Analyses*, SIAM Review, vol. 36, No. 3, (1994) 377-412.

Joshi, R. L. et al., *Comparison of Generalized Gaussian and Laplacian Modeling in DCT Image Coding*, IEEE Signal Processing Letters, vol. 2, No. 5, (May 1995) 81-82.

Lloyd, S. P., *Least Squares Quantization in PCM*, Bell Lab. Memo., Jul. 1957, reprinted in IEEE Transactions on Information Theory, vol. 28, (1982) 129-137.

Max, J., *Quantizing for Minimum Distortion*, IRE Transactions on Information Theory, vol. 6, (1960) 7-12.

Ortega, A. et al.,*Rate-Distortion Methods for Image and Video Compression*, IEEE Signal Processing Magazine, vol. 15, No. 6, (Nov. 1998) 23-50.

Rice, R. F., *Some Practical University Noiseless Coding Techniques*, JPL Publication 79-22, Jet Propulsion Laboratory, Pasadena, CA (Mar. 15, 1979).

Rice, R.F., *Practical Universal Noiseless Coding*, Applications of Digital Image Processing III, SPIE, vol. 207, (1979) 247-267.

Rioul, O. et al., *Wavelets and Signal Processing*, IEEE Signal Processing Magazine, vol. 38, No. 4, Oct. 1991, 14-38.

Said, A. et al., *A New, Fast, and Efficient Image Codec Based on Set Partitioning in Hierarchical Trees*, IEEE Transactions on Circuits and Systems for Video Technology, vol. 6, No. 3, (Jun. 1996) 243-250.

Sweldens, W., *Wavelets and the Lifting Scheme: A 5 Minute Tour*, Zeitschrift fur Angewandte Mathematik und Mechanik, vol. 76 (Suppl. 2), (1996) 41-44.

Wood, R. C., *On Optimum Quantization*, IEEE Transactions on Information Theory, vol. 15, (1969), 248-252.

Information Technology—JEPG 2000 Image Coding System—Part I: Core Coding System, ITU-T T.800, Aug. 2002.

\* cited by examiner

ERROR-RESILIENT ENTROPY CODING FOR PARTIAL EMBEDDING AND FINE GRAIN SCALABILITY

FIELD OF THE INVENTION

Embodiments of the present invention relate generally to methods, apparatus and computer program products for encoding data and, more particularly, to methods, apparatus and computer program products for providing error-resilient entropy coding which supports partial embedding and fine grain scalability.

BACKGROUND OF THE INVENTION

In order to transmit data over channels with limited throughput rates or to store data in limited memory space, it is frequently necessary to compress the data so as to represent the data with fewer bits. Upon receiving or retrieving the compressed data, the data may be decompressed to recover the original data or an approximation thereof.

Compression and decompression techniques are commonly applied to signal, image, and video data in order to reduce otherwise massive transmission and storage requirements. By way of example, a single monochrome image is typically formed by an array of pixels, such as a 512×512 array of pixels. In addition, the intensity level of each pixel is generally assigned a numeric value between 0 and 255, which is digitally represented by an 8-bit pattern. Therefore, the digital representation of such a monochrome image requires approximately 2 million bits of data. As a further example, a typical digital color video format is the Common Intermediate Format (CIF) having a resolution of 360×288. This color video format includes three color components, which are each represented as an array of pixels that are displayed at a rate of 30 frames per second. The three color components are an intensity component at full resolution (360×288) and two chrominance components at half resolution (180×144) each. Thus, the total throughput requirement for CIF is about 37 million bits per second. Thus, the transmission of uncompressed digital imagery requires relatively high throughput rates or, alternatively, relatively long transmission times. Likewise, the storage of digital imagery requires relatively large memory or storage devices.

In order to reduce the storage and transmission requirements for signal, image, and video processing applications, a variety of compression techniques have been developed. Substantial compression is possible due to the statistical redundancy typically found in signal, image, and video data. Such redundancy takes several forms, namely, spatial redundancy due to correlations between pixels within an image or video frame as a function of relative spatial position, temporal redundancy due to correlation between successive or temporally proximate frames in a video sequence or between neighboring signal samples, and spectral redundancy between the color planes or bands of multispectral images. By way of example, this discussion will primarily address the subject of image compression, but the approaches discussed apply to the compression of signal and video data as well.

Image compression techniques attempt to reduce the volume of data by removing these redundancies. These compression techniques may be classified into two broad categories: lossless and lossy. With lossless image compression, a reconstructed image is guaranteed to be numerically identical to the original image. Unfortunately, lossless approaches can provide only a very limited amount of compression (typically less than 3:1). In contrast, lossy techniques achieve higher compression ratios (or lower bit rates) by allowing some of the visual information to be removed, thereby resulting in a difference or distortion between the original image and the reconstructed image. (The bit rate is reciprocally related to the compression ratio.) In general, higher compression ratios (lower bit rates) can be achieved by tolerating higher amounts of distortion. Distortion is commonly measured in terms of mean squared error (MSE), i.e., the mean squared pixel intensity differences between the original and reconstructed images, or conversely by measures of image quality. Root mean squared error (RMS error or RMSE), which is the square root of mean squared error, is also commonly used as an error measure. Common measures of image quality include Peak Signal to Noise Ratio (PSNR), which is closely related to RMS error, or Structural Similarity (SSIM), which measures changes in the "structural information" perceived by the human visual system. Lossy compression approaches seek to maximize the amount of compression while minimizing the resulting distortion (or maximizing the quality of the reconstructed image). If the distortion from a lossy compression process is not visually apparent under normal viewing conditions, the process is commonly called visually lossless compression.

The performance of a signal, image, or video compression algorithm may be characterized by a rate-distortion curve, which plots the distortion measure as a function of the bit rate for the compressed representation. Thus, the objective of a compression algorithm is to minimize the bit rate subject to a constraint on distortion, or conversely to minimize the distortion subject to a constraint on bit rate.

A common approach to image compression, called transform-based compression or transform coding, involves three primary steps, namely, a transform step, a quantization step, and an encoding step. As described in U.S. Pat. No. 5,014,134 to Wayne M. Lawton, et al. and U.S. Pat. No. 4,817,182 to Adelson, et al., an invertible transform decomposes the original image data into a weighted sum of simple building blocks, called basis functions, such as sinusoids or wavelet functions. Accordingly, a number of image transforms have been developed, including the Fourier transform, the discrete cosine transform and the wavelet transform. If the basis functions have sufficient correspondence to the correlation structure of the imagery to be compressed, most of the energy (or information) in the image will be concentrated into relatively few of the transform coefficients with correspondingly large coefficient values. Consequently, the preponderance of the transform coefficients will have small or zero coefficient values.

The wavelet transform decorrelates the image data at multiple resolutions by use of basis functions which are dilations and translations of a single prototype function. The prototype basis function is a bandpass filter called a wavelet, so named because the filter is both oscillatory and spatially localized. The translations and dilations of the prototype wavelet yield a set of basis functions which produce a signal or image decomposition localized in position and resolution, respectively.

The wavelet transform can be computed using a fast discrete algorithm, called the Fast Wavelet Transform (FWT), which recursively applies the wavelet filter and a companion lowpass filter called a scaling filter. For a single iteration of the FWT applied to a one-dimensional signal, the wavelet and scaling filters are convolved against the signal, followed by decimation by two. This process splits the signal into a low resolution approximation signal (extracted by the scaling filter) and a high resolution detail signal (extracted by the wavelet filter). By recursively applying the wavelet filter and the scaling filter to the low resolution approximation signal generated by the prior iteration of the FWT, a multiresolution decomposition of the original signal is produced which consists of the detail signals at various resolutions and a final low resolution approximation signal.

The wavelet transform can be easily extended to two-dimensional imagery by separately filtering the rows and columns and by iteratively processing the lowpass approximation image. This wavelet transform is equivalent to decomposing the image in terms of basis functions which are 2-D tensor products of the 1-D wavelet and scaling filters. See, for example, U.S. Pat. Nos. 5,014,134 and 4,817,182, the contents of which are expressly incorporated by reference herein. See also Oliver Rioul, et al., "Wavelets and Signal Processing", *IEEE Signal Processing Magazine*, vol. 38, no. 4, pp. 14-38 (October 1991); Bjorn Jawerth, et al., "An Overview of Wavelet-Based Multi-Resolution Analyses", *SIAM Review*, Vol. 36, No. 3, pp. 377-412 (1994); and Michael L. Hilton, et al., "Compressing Still and Moving Images with Wavelets", *Multimedia Systems*, Vol. 2, No. 3 (1994) for further descriptions of the wavelet transform.

Once the image data has been transformed, the compression algorithm then proceeds to quantize and encode the transform coefficients which are generated by the wavelet transform. The quantization step discards some of the image content by approximating the coefficient values. Quantization generally involves a mapping from many (or a continuum) of input values to a smaller, finite number of output levels. The quantization step divides the range of input values by a set of thresholds $\{t_i, i=0, \ldots N-1\}$ and maps an input value falling within the interval $(t_i, t_{i+1}]$ to the output value represented by the discrete symbol or quantization index i. Correspondingly, dequantization (used to recover approximate coefficient values during decompression) maps the quantization index i to a reconstructed value $r_i$ which lies in the same interval, i.e., $(t_i, t_{i+1}]$. For minimum RMS error, the reconstructed value should correspond to the mean of those coefficient values falling within the interval, but, in practice, a reconstruction value at the center of the interval is often used. Further, scalar quantization maps a single scalar value to a single discrete variable, whereas vector quantization jointly maps a plurality (or vector) of M values to each discrete variable.

While the quantized coefficient values have reduced precision, they also can be represented with fewer bits, thus allowing higher compression at the expense of distortion in the reconstructed image. This image distortion is referred to as quantization error and accounts for all of the distortion inherent in lossy compression schemes. Thus, the quantization step is omitted for lossless compression approaches.

A variety of factors contribute to the choice of the actual quantization intervals, such as the desired compression ratio, the statistical distribution of the coefficient values, the manner in which the quantized coefficient values will be encoded, and the distortion metric used to measure image degradation. When the quantized coefficients will be entropy-coded, RMS error can be (approximately) minimized by using uniform quantization intervals. See R. C. Wood, "On Optimum Quantization", *IEEE Transactions on Information Theory*, Vol. 15, pp. 248-52 (1969). In the absence of entropy coding, the RMS error is minimized by choosing nonuniform quantization intervals in accordance with the Lloyd-Max algorithm as described in S. P. Lloyd, "Least Squares Quantization in PCM", Bell Lab. Memo. (July 1957), reprinted in *IEEE Transactions on Information Theory*, Vol. 28, pp. 129-37 (1982), and also in J. Max, "Quantizing for Minimum Distortion", *IRE Transactions on Information Theory*, Vol. 6, pp. 7-12 (1960).

Due to the decorrelating properties of the wavelet transform, the distribution of transform coefficient values is typically sharply peaked at zero. Similar decorrelating effects may be commonly achieved by alternate techniques such as the block discrete cosine transform or predictive coding. This type of peaked coefficient distribution results in a preponderance of coefficients falling into the quantization interval at the origin, i.e., the quantization interval centered on the value of zero. Due to the preponderance of coefficients near zero, more efficient compression performance can be achieved by treating the quantization interval at the origin separately. In particular, the overall coding efficiency may be increased by using a larger quantization interval around the origin, often called a dead zone. In one preferred embodiment, the dead zone interval is twice as large as the adjacent intervals. The dead zone is centered about the origin with a reconstruction value exactly equal to zero to prevent artifacts resulting from the use of nonzero reconstruction values for the many coefficients close to zero. The magnitude of the positive and negative bounds of the dead zone is termed the clipping threshold because all coefficients whose magnitudes fall below this threshold are "clipped" to zero. In addition, those coefficients whose magnitudes exceed the clipping threshold are termed significant coefficients, while those coefficients whose values lie below the threshold (i.e., within the dead zone) are termed insignificant coefficients.

Dead zone quantization may be simply implemented by applying the quantization process to the magnitudes (or absolute values) of the coefficients, and discarding the sign information for the insignificant coefficients (i.e., with magnitudes less than the clipping threshold). This strategy used in combination with uniform quantization results in a dead zone which is approximately twice as large as the other quantization intervals.

Because most of the coefficients produced by the transform have small magnitudes or are equal to zero, the quantization process typically results in the majority of the coefficients being deemed insignificant, while only relatively few of the quantized coefficients have magnitudes exceeding the clipping threshold which are deemed significant. Thus, as indicated above, it is advantageous to treat the significant coefficients separately from the insignificant coefficients.

This separate treatment may be accomplished by separately indicating the positions and the quantized values of the significant coefficients. In addition, the positions of the significant coefficients can be represented using one of a variety of conventional approaches, such as tree structures, coefficient maps, or run length coding. For example, the positions of the significant coefficients may be represented by means of run lengths of consecutively occurring insignificant coefficients or by alternating run lengths of consecutive significant coefficients and consecutive insignificant coefficients.

To achieve further compression, the quantized values and the position information for the significant coefficients may both be coded using any of a variety of entropy coding approaches, which are designed to encode data sources with reduced size or volume, while allowing the original sequence of data to be recovered exactly. The entropy of a data source is a mathematical measure of the information in the source as a function of the source statistics. Entropy is commonly defined in units of bits per source symbol. The entropy of a particular source defines the lower bound or the theoretical minimum bit rate at which the source can be represented. The objective of entropy coding is to minimize the bit rate for the compressed representation, with the entropy of the source defining the ultimate limit of that compression performance. The amount by which the bit rate for the compressed representation exceeds the entropy of the source is called the redundancy, and is often defined in terms of a percentage.

Entropy coding may reduce the number of bits required to represent a data set by using variable length coding in a manner which exploits the statistical probabilities of various symbols in the data set. For example, entropy coding assigns shorter code words to those symbols which occur frequently, while longer code words are assigned to those symbols which occur less frequently. Entropy coding is completely reversible so that no additional distortion is introduced beyond that due to the quantization process.

Entropy coding (as well as other forms of coding) defines a mapping from an alphabet of source symbols to a set of code words constructed from a code alphabet. The mapping from source symbols to code words is defined by a codebook which must be known to both the encoder and decoder. Various coding methods are sometimes categorized based on how the codebook is determined or defined. Static codes are codes in which the codebook is fixed and known a priori to both the encoder and decoder. Static codes are appropriate when the statistics of the source sequence are known in advance and relatively stationary.

Forward adaptive codes define a codebook based on the statistics of source symbols which have not yet been coded (i.e., the codebook estimation process looks forward). Forward adaptive coding requires two passes through the sequence or block of source symbols, a first pass to collect source statistics followed by a second pass to encode the data. Forward adaptive codes require that the codebook information (or the underlying statistics) be transmitted from the encoder to the decoder as side information or overhead. Forward adaptive codes are also sometimes called off-line adaptive or block adaptive codes.

Backward adaptive codes estimate the codebook "on the fly", based on the statistics of previously coded symbols (i.e., the codebook estimation process looks backward). Backward adaptive coding requires only a single pass through the sequence or block of source symbols, performing both the coding and the statistical estimation. Typically, the source statistics are modeled in the form of a histogram of the symbol occurrences or by one or more scalar parameters which characterize a mathematical model of the source. (A histogram is a discrete distribution consisting of individual bins representing the frequency or probability of occurrence of the associated distribution values). The statistical model and the resulting codebook may be updated after every source symbol or at less frequent intervals. The statistical model typically includes some form of "forgetting factor" to prevent overflow of accumulated statistics and to weight recent symbols more heavily. The codebook estimation is performed in synchronized fashion by both the encoder and decoder, thus eliminating the need for any explicit side information or overhead to pass the codebook from the encoder to the decoder. While backward adaptive coding requires no explicit side information, the coding is inefficient until the codebook converges to an effective approximation of the source statistics. The resulting coding inefficiencies constitute a form of "implicit side information". An important factor in the performance of a backward adaptive code is the speed of convergence. Backward adaptive codes are also sometimes called on-line adaptive codes.

Perhaps the most well-known method of entropy coding is Huffman coding, which represents the data symbols using code words that each consist of an integer number of bits (as described in D. A. Huffman, "A Method for the Construction of Minimum Redundancy Codes," *Proceedings of the IRE*, vol. 40, no. 10, pp. 1098-1101, (1952)). Due to the constraint of an integer code word length, Huffman coding cannot in general achieve a bit rate equal to the entropy of the source. However, Huffman coding is optimal in the sense that it minimizes the bit rate subject to the constraint of integer code word length. Hence, Huffman coding is an example of what are known as minimum redundancy codes. The minimum redundancy property for Huffman codes rests on the observation that the two least probable symbols must have the same code word length (or else it would be possible to reduce the length of the longer code word). Based on this observation, the Huffman coding procedure forms a codebook starting from the two least probable symbols and works towards more probable symbols.

Another popular entropy coding approach is arithmetic coding, which is capable of producing code words whose length is a fractional number of bits (as described in I. H. Witten, R. M. Neal, and J. G. Cleary, "Arithmetic Coding for Data Compression," *Communications of the ACM*, vol. 30, no. 6, pp.520-540, (June 1987)). In arithmetic coding, the entire bitstream is essentially a single large codeword that represents the entire message, which makes it feasible to use a fractional number of bits to represent specific source symbols. Because arithmetic coding is not constrained to integer codeword lengths, it can achieve bit rates which are only negligibly larger than the entropy. However, arithmetic coding typically requires relatively more computation than alternative approaches.

Parametric entropy coding provides a simplified approach to entropy coding. While traditional entropy coders estimate a codebook based on the raw empirical statistics of the source (typically represented in a histogram), parametric entropy coders use an approximation of the source statistics based on an appropriate mathematical or statistical distribution function. For example, the exponential distributions and Laplacian (two-sided exponential) distributions have proven particularly useful for modeling data sets that arise during signal, image, and video compression. With the parametric approach, the codebook is determined by one to several parameters, which may be either parameters which characterize the distribution model or parameters of the entropy coder itself which in turn may impute an appropriate distribution function. In addition to computational simplicity, parametric entropy coding provides a simplified model for the source, which thus may reduce the amount of side information for forward adaptive coders or provide faster adaptation to the source statistics for backward adaptive coders. A simplified source model may be particularly beneficial when the source statistics are highly nonstationary (i.e., when the statistical characteristics of the source change rapidly). Two popular examples of parametric coding are Golomb coding (described in S. W. Golomb, "Run-Length Encodings," *IEEE Transactions on Information Theory*, vol. 12, no. 3, pp. 399-401, (July 1966)) and Rice coding (described in R. F. Rice, "Some Practical Universal Noiseless Coding Techniques," JPL Publication 79-22, Jet Propulsion Laboratory, Pasadena, Calif. (March 15, 1979)), which is a constrained form of Golomb coding.

A popular variation of transform coding is embedded coding. See, for example, U.S. Pat. No. 5,315,670 to Jerome M. Shapiro. See also Jerome M. Shapiro, "Embedded Image Coding Using Zerotrees of Wavelet Coefficients," *IEEE Transactions on Signal Processing*, vol. 41, pp. 3445-3462 (1993); A. Zandi, J. D. Allen, E. L. Schwartz, and M. Boliek, "CREW: Compression with Reversible Embedded Wavelets," Preprint, Ricoh California Research Center, Menlo Park, Calif. (1995); and Amir Said and William A. Pearlman, "A new, fast, and efficient image codec based on set partitioning in hierarchical trees," *IEEE Transactions on Circuits and Systems for Video Technology*, Vol. 6, No. 3, pp. 243 (June 1996) for descriptions of various embedded coding approaches.

Commonly in embedded coding, a decorrelating transformation, such as the wavelet transform or block discrete cosine transform, is first applied to the signal or image data (or to each image plane of video, color, or multispectral data), as described above. The coefficients within the resulting subbands or frequency bands are then encoded one bitplane at a time, starting from the most significant bitplane of the coefficient magnitudes and continuing to less significant bitplanes. Commonly, the subbands or frequency bands (for each image plane) are spatially partitioned (to support improved scalability and random access on a spatial basis). The spatial partitions of the subbands are sometimes referred to as precincts, and the precincts may commonly be subdivided into even smaller spatial subdivisions sometimes called codeblocks. Each bitplane of each codeblock is encoded independently, with causal dependence only upon the more significant bitplanes of the same codeblock. In some variations of embedded coding, this dependence extends also to "parent coefficients" at coarser resolution subbands (where parent coefficients are coarser resolution coefficients at the corresponding spatial position).

The encoding of each bitplane is commonly performed in multiple passes. The first pass in each bitplane encodes information about which coefficients are "newly significant" for the current bitplane. (Newly significant coefficients are coefficients whose magnitudes are insignificant (zero) at more significant bitplanes, but which become significant (non-zero) when the current bitplane is included.) The sign for each newly significant coefficient is also encoded. The second pass in each bitplane encodes refinement information for coefficients which were previously significant (i.e., the magnitude bit within the current bitplane for coefficients which were significant at the more significant bitplanes). Some implementations subdivide the encoding of refinement information into two passes in order to provide finer granularity on the encoded data. The entropy coding method used in embedded coding is commonly a context-adaptive binary arithmetic coder, although sometimes other coding methods are used. Commonly, the binary arithmetic coder encodes the significance or non-significance for each previously insignificant coefficient, as well as the sign bit for each newly significant coefficient, and finally the refinement bit for each previously significant coefficient. For context adaptivity, the arithmetic coder makes use of the already encoded information from nearby coefficients in the same codeblock (or from coarser resolutions when dependence extends to parent coefficients).

The sequential coding of the coefficient bitplanes, starting from the most significant bitplane and proceeding to less significant bitplanes, provides a mechanism for successive approximation of the coefficient values wherein the number of bitplanes included in the coding determines the fidelity of the resulting approximation. From this perspective, the embedded coding process can be seen to implement a progressive uniform quantizer with a dead zone approximately twice as large as the nominal quantization interval. Accordingly, embedded coding is sometimes referred to as embedded quantization. If the transform is a reversible transform and the bitplane coding proceeds to "completion" (i.e., to the coding of the least significant bitplane for all subbands), then lossless compression will be supported.

The encoded data from each bitplane pass or from a set of consecutive passes may be aggregated to form a bitstream packet. When limited causality or dependence is used in the bitplane coding, then the bitstream packets generated by embedded coding may be flexibly sequenced to achieve a variety of progressive coding effects. Progressive coding refers to the sequencing or ordering of encoded content within a compressed bitstream in accordance with a prescribed priority scheme, in order to provide more favorable treatment to higher priority content.

The prioritization of content for progressive coding may be based on a variety of considerations including resolution, spatial position, image quality, spectral or color band, region of interest designation, or combinations thereof. For the purposes of this discussion, we shall refer to the considerations by which a progression is prioritized as progression aspects. For example, when the packets are ordered according to the progression aspect of distortion in the reconstructed image or signal, then a "quality progression" is obtained. The choice of progression priorities is typically set by the user or fixed for the application. Packet ordering is constrained by the causality of the coding, i.e., no packet may precede another packet on which it is dependent.

An example of progressive coding options may be found in the JPEG 2000 standard (specified in ISO/IEC 15444-1:2002, "Information technology—JPEG 2000 image coding system—Part 1: Core coding system," (January 2001)), which defines progression priority based on such progression aspects as quality layer (L), resolution (R), position (P), and color or spectral component (C). Thus an LRCP priority orders the encoded blocks first according to quality layer (PSNR), followed by resolution, component, and finally position. The RLCP priority orders the encoded blocks first according to resolution, followed by quality layer, component, and finally position. The five progression sequences supported in JPEG 2000 are LRCP, RLCP, RPCL, PCRL, and CPRL.

The ability to dynamically truncate a progressively coded bitstream is commonly referred to as scalability, such as resolution scalability, spatial scalability, or quality scalability depending upon the progression priority of the bitstream. The granularity of scalability refers to the resolution or size at which the scalable bitstream may be truncated. If the bitstream may be truncated at a very fine resolution, such as at the level of bits, bytes, or very small packets, then the scalability is called fine grain scalability.

Progressively encoded data is often generated in two processing stages: (1) a coding stage in which the data is actually encoded, and (2) a sequencing stage in which the encoded content is ordered or sequenced in accordance with the defined progression priority. (In JPEG 2000, these two stages are referred to as Tier 1 and Tier 2 processing, which terminology will be retained herein.) For decoding, the tier 1 and tier 2 processing stages are reversed in order. The order in which the data is generated during tier 1 processing is typically determined based on considerations which minimize memory and computational requirements or in accordance in the order in which the data may be provided from the source. The tier 2 processing typically has comparatively low computational cost relative to tier 1.

When progressively coded data is transmitted over a channel, the process is commonly referred to as progressive transmission. In this case, the transmission is progressively received (with content ordered in accordance with the progression priority) until it is completed or until it is terminated by events such as packet loss, timeout, or user action. With progressive transmission, it is possible to incrementally update the display as the content is received. This approach is commonly used within web browsers to display progressively received image content.

Favorable treatment of high priority content in progressive coding is achieved by placement earlier in the bitstream. Because later positions in the bitstream are subject to greater exposure to a wide variety of error effects, earlier placement within the bitstream offers a very simple mechanism for providing more protection to higher priority content. Some examples of effects which expose later portions of the bitstream to a higher incidence of errors include termination of progressive transmission, truncation of a bitstream to meet bit rate targets, the use of Droptail buffering policies in QoS protocols, and various other limitations on storage and transmission channel bandwidth. In some applications, more elaborate protection schemes may be used to provide even higher levels of protection for high priority content. One common approach is to use varying levels of error correction coding (ECC) according to the priority of the content. Another approach is to transmit different blocks using different channels of a quadrature amplitude modulation (QAM) constellation, with the different channels inherently subject to differing signal to noise ratios. Both of these approaches are commonly called unequal error protection (UEP). Still a third approach is to apply different strategies for block retransmission in an Automatic Repeat-reQuest (ARQ) error control protocol, so that higher priority blocks are retransmitted upon errors, while lower priority blocks are not.

With embedded coding, the resulting bitstream may be truncated (by dropping packets from the end of the bitstream) to meet a target bit rate (i.e., compression ratio). (For some implementations, the truncation may operate at granularities finer than the individual packet level, down to individual bytes or bits, providing fine grain scalability.) The name embedded coding derives from the fact that a compressed bitstream contains all compressed bitstreams of higher compression ratio "embedded" within it. By truncation of the embedded bitstream, the compression ratio or bit rate may be dynamically varied. Such truncation results in requantization of the affected coefficients, resulting in increased distortion in the reconstructed image. When the packets are aggregated at the bitplane level (or a finer level) and are ordered in a quality progression, then the truncation of the resulting bitstream achieves rate-distortion performance which is nearly optimal, subject to the constraints of the transform and encoding methods used to produce the bitstream.

Embedded coding thus provides many desirable properties, including variable rate control from a single compressed image file, support for a variety of progressive coding modes, and suitability for use with schemes which provide more favorable treatment or protection to higher priority content. The primary drawback of embedded coding is that it is computationally expensive, due to the fact that the encoding of the bitplanes requires repeated analysis passes through the coefficients. The context adaptivity of the entropy coding can also add considerably to this complexity. The decoding is similarly expensive with decoding of the bitplanes requiring repeated conditional refinement of the coefficients. Thus, the computational cost of embedded coding has limited its use in many applications.

In addition to the embedded coding methods described above, an alternative approach offers reduced computation by adaptively varying the granularity of the embedded coding, as described in C. D. Creusere, "Fast Embedded Compression for Video," *IEEE Transactions on Image Processing*, vol. 8, pp. 1811-1816 (December 1999). The granularity of the embedding may range from coarse embedding, for which each quality layer is generated from two or more bitplanes encoded during a single pass, to fine embedding, for which a quality layer (possibly subdivided into significance and refinement layers) is generated from a single bitplane encoded during a single pass. With this approach, multiple bitplanes may be encoded during each pass through the coefficients, thus reducing the number of passes. Since truncation of the bitstream operates first on the final quality layer, the granularity of the embedding typically includes only a single bit plane (the least significant bitplane after any quantization) in the final embedded layer. If the truncation of the embedded bitstream is limited to this final (single bit plane) layer, then the rate-distortion performance is not degraded in comparison to a fully embedded bitstream.

It is thus desirable to provide improved techniques for encoding data which provide some of the progressive and layered coding properties of embedding coding without requiring repeated passes through the coefficients for the encoding/decoding of individual bitplanes. If such a method can be achieved as a natural byproduct of the entropy coding method, then many of the benefits of embedded coding can be obtained with significant computational savings and a simpler implementation.

BRIEF SUMMARY OF THE INVENTION

Methods, apparatus and computer program products are therefore provided in accordance with certain embodiments of the present invention to provide entropy coding methods which support partially embedded coding of signal, image, and video data. For entropy coding with partial embedding, these coding methods generate code words representative of the data to be encoded, with each code word having first and second portions, such that the first portion of each code word includes information that is representative of a predetermined characteristic of the second portion of said code word while the second portion of each code word includes information that is representative of a respective portion of the data encoded by the code word. For the purposes of clarity, the first portion of a code word will be referenced as a prefix field and the second portion of a code word will be referenced as a suffix field.

In order to support partial embedding, a plurality of blocks may be defined, with each block including one or more bitplanes extracted from certain of the aforementioned suffix fields of the code words. In this regard, a bitplane is the set of bits having the same significance position within each of the suffixes. The bitplanes may be further subdivided in accordance with the image plane and/or the subbands of the image transform. A bitplane may also refer to a set of bits having the same significance position within each of the suffixes of a spatial subset of a given subband.

In one embodiment, the plurality of blocks can then be separately processed, such as by placing the blocks in sequence at the end of the compressed bitstream, in a progression based upon the relative priority of the respective blocks. The progression priority of an individual block may be defined within the framework of a specified progression priority scheme as function of a combination of the significance of constituent bitplanes of the block, and/or the resolution, spatial position, and/or spectral band of the associated coefficient. Other factors may also be included in the block priority. In such an embodiment, the plurality of blocks would accordingly be sequenced starting with the highest priority blocks and proceeding to the lower priority blocks.

In accordance with one aspect, a method is provided that generates a plurality of code words representative of data to be encoded. In this regard, code words may be generated having prefix and suffix fields with each prefix field including information that is representative of a predetermined characteristic of the associated suffix field and each suffix field including information that is representative of a respective portion of the data. The method may also define a plurality of blocks, with each block including one or more bitplanes extracted from certain of the aforementioned suffix fields of the code words. In this regard, a bitplane is the set of bits having the same significance position within each of the suffixes within a given subband of the transform of a given image plane. A bitplane may also refer to a set of bits having the same significance position within each of the suffixes of a spatial subset of a given subband. In this regard, the plurality of blocks may be defined such that each block includes a different bitplane that is not included in any other block.

In one embodiment, each bitplane has an associated priority, with said priority evaluated as a function of the constituent bitplane significance, and/or coefficient position, resolution, and/or band in accordance with a specified progression priority scheme. As such, the method of this embodiment may order the blocks in accordance with their respective priority. For example, the blocks may include first and second blocks with the first block including one or more bitplanes that have higher priority than the bitplanes in the second block.

In accordance with one embodiment, the data is transformed and quantized prior to the generation of the code words. In this embodiment, the data may be transformed based upon a predetermined transformation function. The transformed data may then be quantized such that the quantized data has been fewer unique coefficients then the transformed data. The plurality of code words may then be generated to be representative of the quantized data.

In accordance with another aspect of the present invention, an apparatus including a processor is provided for generating a plurality of code words, defining a plurality of blocks which may then be sequenced so as to provide a partially embedded bitstream as set forth above. In yet another aspect of the present invention, a computer program product having a computer readable storage medium and computer-readable program code portion stored therein is provided that is also configured to generate a plurality of code words, define a plurality of blocks and sequence the blocks for a partially embedded bitstream in the manner described above. As such, the methods, apparatus and computer program products of certain embodiments of the present invention may provide an error-resilient method of entropy coding which supports ordering of the coded data to generate a partially embedded bitstream, thus offering the beneficial progressive and layered coding properties of embedded coding without the typically associated large computational cost.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION OF THE INVENTION

The present inventions now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

Figure 1:
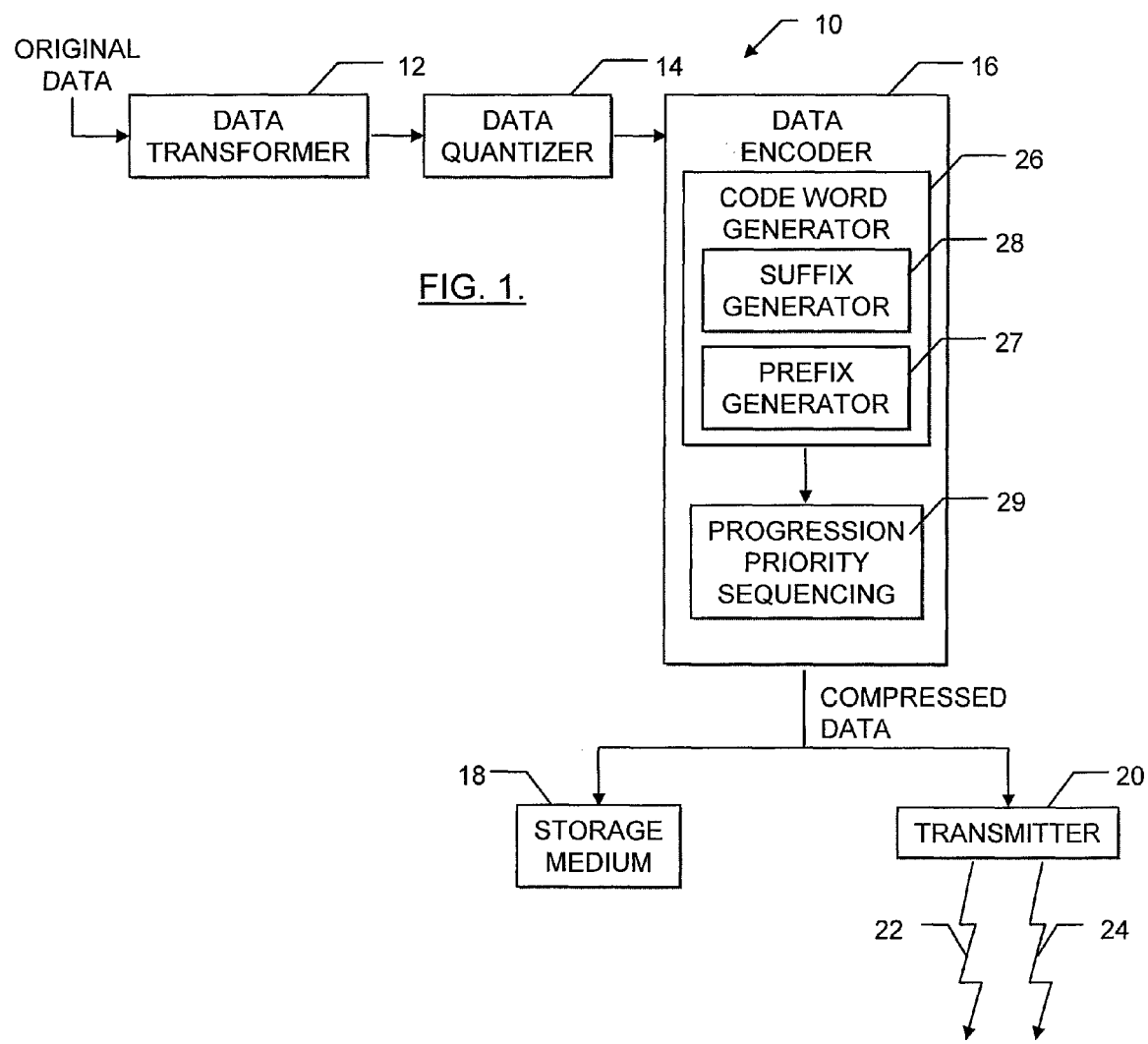
FIG. 1 is a block diagram of an error resilient data compression apparatus, including an error resilient data encoder, according to one embodiment of the present invention.

According to certain embodiments of the present invention, a method and apparatus for layered error-resilient entropy coding of data is provided. As illustrated in FIG. 1, the method and apparatus for layered error-resilient coding can form one portion of a method and apparatus 10 for compressing or decompressing data which is thereinafter or has been stored and/or transmitted. However, the error resilient method and apparatus for encoding or decoding data can be employed in other applications, including applications in which the data has not been transformed and quantized as shown in FIG. 1 and described hereinafter, without departing from the spirit and scope of the present invention.

Figure 2:
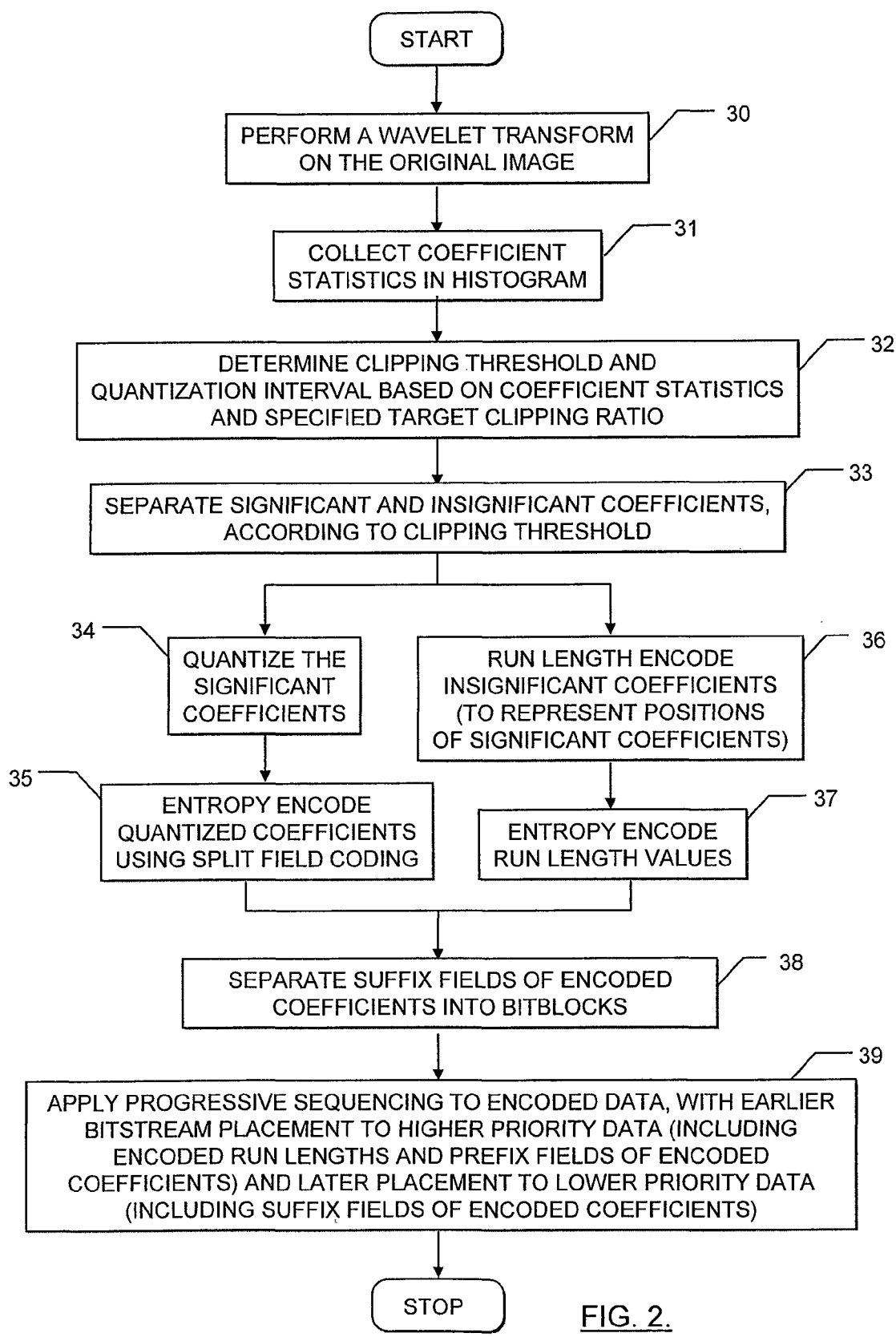
FIG. 2 is a flow chart illustrating operations for compressing data, including operations for encoding data, according to one embodiment of the present invention.

According to the embodiment of the present invention shown in FIG. 1 and, in more detail, in block 30 of FIG. 2, the original data is initially transformed, such as by a data transformer 12. In one application, the original data is a monochromatic image formed by an array of pixels, such as a 512×480 array of pixels, each of which has a gray level which can be digitally represented, such as by an 8-bit binary representation. However, the method and apparatus of other embodiments can encode other types of data without departing from the spirit and scope of the present invention.

The original data can be transformed based upon one of a number of predetermined transforms, each of which describes the signal in terms of a set of functions called basis functions, such as cosine functions or complex exponentials (general sinusoids). However, one particularly advantageous transform is a wavelet transform and, more particularly, a biorthogonal wavelet transform which represents a function in terms of biorthogonal wavelets as described in A. Cohen, "Biorthogonal Wavelets", *Wavelets—A Tutorial in Theory and Applications*, C. K. Chui (ed.) (1992).

As known to those skilled in the art, a wavelet transform filters a signal using a pair of digital filters, typically referred to as a scaling filter and a wavelet filter. The scaling filter is a lowpass filter which generates a lower frequency approximation signal. In contrast, the wavelet filter is a high-pass filter which extracts a higher frequency detail signal. Because the filters split the information of the original signal into two frequency bands, the filtered signals can be subsampled, i.e., every other data point may be discarded, without losing information. By recursively applying the scaling filter and wavelet filter to the approximation signal of the prior iteration, the original signal can be decomposed into multiple resolutions.

The orthogonality/biorthogonality properties of wavelet filters produce filter structures which can be factored into pre-filters, resulting in simplified convolution computations. Factorization of the wavelet filters offers several benefits, including reduced computation and reversible transforms (with perfect reconstruction). Perfect reconstruction is possible because the factorization of the filters decomposes the convolution operations into simple steps, which can be arranged so that any roundoff errors on the forward transform can be cancelled out by equal and opposite roundoff errors on the inverse transform. This approach also allows perfect reconstruction transforms to be computed with fixed point implementations with precision only a few bits greater than the pixel depth of the image, which further reduces computation and conserves memory requirements. Although factorizations of wavelet transforms were practiced within the signal processing/subband coding community since at least the late 1980s, this approach was especially popularized during the mid 1990s by Wim Sweldens and his collaborators under the name of "the lifting scheme", as described in I. Daubechies and W. Sweldens, "Factoring Wavelet Transforms into Lifting Steps," *Journal of Fourier Analysis Applications*, pp. 68-79, Proc. SPIE 2569 (1995), and in W. Sweldens, "Wavelets and the Lifting Scheme: A 5 Minute Tour," *Zeitschrift für Angewandte Mathematik und Mechanik*, vol. 76 (Suppl. 2), pp. 41-44 (1996).

The wavelet transform can be easily extended to two-dimensional imagery by separately filtering the rows and columns of the 2-D image. This process is equivalent to filtering the image using a set of four 2-D filters which are 2-D tensor products of the 1-D scaling and wavelet filters. This filtering in 2-D produces four subband images, namely, an approximation image resulting from lowpass filtering by the scaling filter in both dimensions and three detail images resulting from highpass filtering in at least one dimension. By recursively applying the scaling filter and wavelet filter to the approximation image of the prior iteration, the original 2-D image can be decomposed into multiple resolutions.

Figure 3:
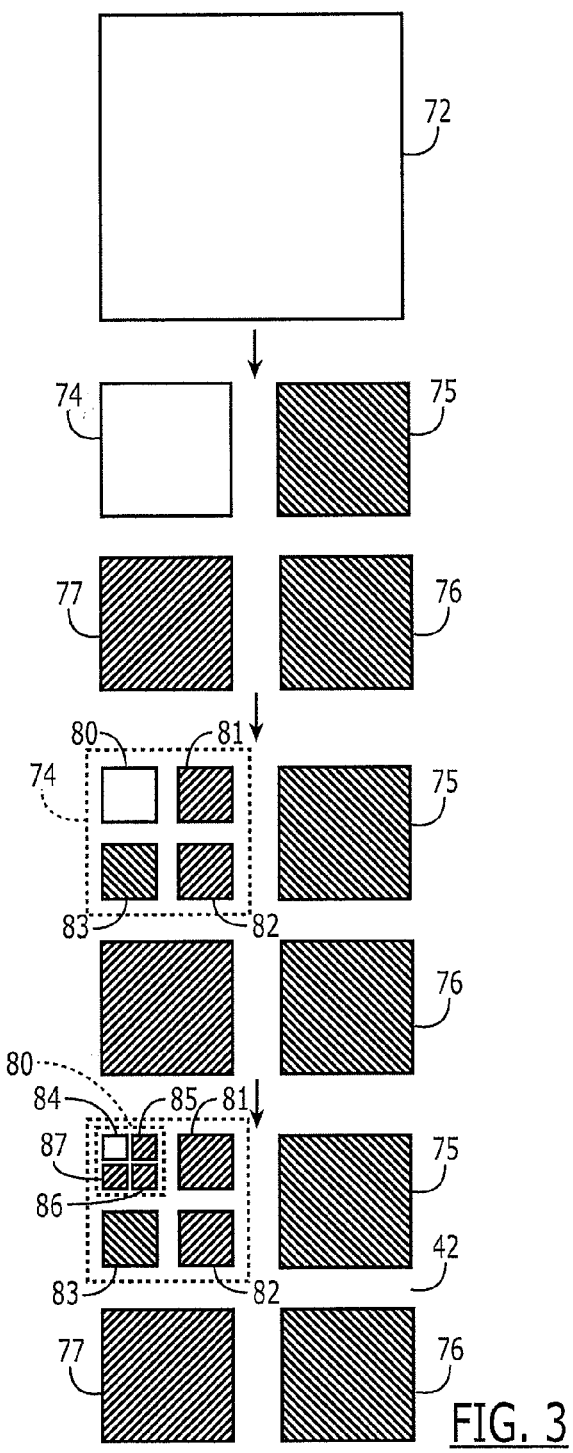
FIG. 3 illustrates the decomposition of an original image into a plurality of higher resolution detail images and one lower resolution approximation image.

By way of example, FIG. 3 depicts the results of the filtering process after each of three iterations. At each iteration, the resulting approximation image is shown in white and the three detail images are shaded. As shown, the first iteration decomposes the original image 72 into four subband images 74-77 at a fine scale or resolution which shall be referred to as scale 1 for purposes of illustration. The second iteration decomposes the approximation image 74 from scale 1 into four subband images 80-83 at the next coarsest scale which shall be referred to as scale 2. The third iteration repeats the process, thereby decomposing the approximation image 80 from scale 2 into four subband images 84-87 at scale 3. The process is commonly iterated to a very coarse scale at which the subband images may be very small, e.g., on the order of 8×8. The resulting multiresolution wavelet decomposition of the original image 72 is typically decorrelated such that redundancies, such as spatial redundancies, within the original data can be exploited during the compression process. See U.S. Pat. No. 5,014,134 for a further description of an exemplary wavelet transformation process. For convenience, the elements of the various component images are hereafter referred to as pixels, even though these elements are not true picture elements, but are coefficients of the transformed image. See also U.S. Pat. No. 5,850,482 to James J. Meany, et al. for the further discussion of wavelet and scaling filters.

The scaling and wavelet filters are typically convolved with the array of pixels on a row-by-row basis, followed by a convolution of the scaling and wavelet filters with the array of pixels on a column-by-column basis. As described above, the scaling and wavelet filters are recursively applied to the approximation image of the prior iteration to decompose the image data into multiple resolutions.

Following the transform, the original image 72 is represented by a number of detail images 75-77, 81-83 and 85-89 of varying resolution and one approximation image 84 at the coarsest resolution. As shown in FIG. 3, each of these images is comprised of an individual array of pixels which forms a portion of an overall array of pixels 42.

The transformed data is then quantized, such as by a data quantizer 14, such that the quantized data has fewer unique data values or coefficients than the transformed data, as shown in block 34 of FIG. 2. A quantizer generally maps from many (or a continuum) of input values to a smaller, finite number of output levels. The quantizer is applied to the magnitudes (or absolute values) of the transform coefficients, dividing the range of coefficient magnitudes by a set of thresholds $\{t_i, i=0, \ldots, N-1\}$, with $t_0=0$. The quantizer then maps a magnitude falling into an interval $(t_i, t_{i+1}]$ to an output level designated by the discrete symbol or quantization index i. According to one typical embodiment, the quantizer may use uniform quantization intervals having widths of value Q. During decompression, a dequantizer which is designed to recover approximate coefficient magnitudes of the transformed data can map the quantization index i to a reconstructed value $r_i$ which lies in the same interval, i.e., the interval $(t_i, t_{i+1}]$. To minimize the RMS error, the reconstructed value for the magnitude generally corresponds to the mean of those coefficient values falling within the interval. However, the reconstructed value can be assigned other values within the interval, such as a value at the center of the interval for purposes of simplicity.

According to one embodiment, the smallest non-zero threshold, $t_1$, is referred to as the clipping threshold because coefficients with magnitudes less than this threshold are "clipped" to zero. We shall denote the value of the clipping threshold as T. The transform coefficients whose magnitudes fall below the clipping threshold level are mapped to the quantization index i=0. During decompression, these coefficients (with quantization index i=0) are in turn mapped to a reconstructed value of zero. Thus, those coefficients with magnitudes falling below the clipping threshold do not contribute any information or energy to the reconstructed image, and are designated as insignificant coefficients. In contrast, the transform coefficients with magnitudes greater than or equal to the clipping threshold do contribute information to the reconstructed image, and are designated as significant coefficients. The sign information for the insignificant coefficients is typically discarded, effectively combining the quantization intervals for the positive and negative insignificant coefficients into a single quantization interval (−T, +T) which is commonly called the dead zone.

There are a variety of strategies for determining how the quantization may be applied to the plurality of subbands produced by the wavelet transform. For example, the settings for the clipping threshold T and the quantization interval Q (typically with Q=T) may differ from subband to subband. The quantization settings for each respective subband affect how each subband contributes to the overall bit rate and to the overall distortion of the compression algorithm. As known to those skilled in the art, the rate-distortion performance is optimized when for any given value of the overall bit rate, the marginal rate-distortion slope (i.e., the marginal change in distortion due to the marginal change in bit rate) is equal (or approximately equal) for all of the subbands. This equalization of the marginal rate-distortion slope between the subbands is achieved by appropriate choice of the quantization settings for the respective subbands. See for example, A. Ortega and K. Ramchandran, "Rate-distortion methods for image and video compression," *IEEE Signal Processing Magazine*, vol. 15, no. 6, pp. 23-50 (Nov. 1998). The process of determining the appropriate quantization of the subbands is often called bit allocation because it determines how the bit rate budget is allocated among the subbands. Unfortunately, the process of estimating the rate-distortion slopes for the individual subbands is computationally expensive and is often not practical.

A simpler alternative strategy for allocation of bit rate and quantization among the subbands is to use a global quantization value (used for the clipping threshold and the quantization interval), which is applied to each respective subband in accordance with an appropriate normalization for the coefficient values within the subband. For an orthonormal transform (with orthogonal basis functions normalized according to an $L^2$ normalization), $L^2$ measures (such as energy and RMS error) are preserved between the image domain and the transform domain. Even for the case where the transform is biorthogonal, the basis functions are nearly orthogonal, so that the transform approximately preserves $L^2$ measures between the image and transform domains. As noted above, RMS error can be approximately minimized by combining uniform quantization with entropy coding of the quantized coefficients. (See R. C. Wood, "On Optimum Quantization", *IEEE Transactions on Information Theory*, Vol. 15, pp. 248-52 (1969).) Assuming the use of entropy coding, this means that the goal of minimizing the RMS error in the image domain can be approximately achieved by use of uniform quantization of the $L^2$ normalized coefficients, which minimizes RMS error in the transform domain. When the transform computations are not $L^2$ normalized, then the global quantization value setting can be scaled according to the relative normalization of each subband to produce the same result as $L^2$ normalized quantization. Strategies which seek to minimize perceptual error (rather than RMS error) may be supported by imposing additional perceptual weighting factors on the quantization of subbands at various resolutions or scales. These perceptual weighting factors may typically be chosen in accordance with the contrast sensitivity function of the human visual system. Thus, the overall strategy for quantization of the coefficients may be controlled by a global quantization value, which may be set by the user or fixed for the application.

As an alternative to the use of a specified global quantization value, the error resilient method and apparatus for compressing data may also control the quantization by means of a specified target clipping ratio value, which designates a predetermined proportion of the transform coefficients which will become insignificant under quantization. According to one embodiment as shown in block 50 of FIG. 4, a target clipping ratio, such as 50:1, is set by the user or is fixed for the application. The clipping ratio defines the ratio of the total number of coefficients (significant and insignificant) to the number of significant coefficients. As described hereinafter and as shown in block 32 of FIG. 2, the method and apparatus of certain embodiments of the present invention can then set the clipping threshold to the smallest threshold for which the resulting clipping ratio equals or exceeds the target clipping ratio. A higher compression ratio can generally be obtained by higher clipping ratios. However, the amount of distortion in the reconstructed image also increases with an increase in the clipping ratio.

The relationship between the clipping threshold and the clipping ratio is captured in the statistics of the transform coefficients, which are commonly represented by means of a histogram, or discrete coefficient distribution, which includes a plurality of bins, with each bin recording the number of occurrences of an associated coefficient value. While it is possible to utilize a separate histogram to represent the statistics of each respective subband, it is convenient for many applications to collect the statistics for all of the transform coefficients across all subbands in a global coefficient histogram as shown in block 31 of FIG. 2.

While popular wavelet transform implementations, such as the lifting scheme, utilize fixed point representations of the wavelet coefficients which are not $L^2$ normalized, these subband normalizations are related by integer scale factors (usually powers of 2) which may be used to compensate for differences between the $L^2$ normalization and the actual normalization of the subbands. Using such scale factors, the statistics from all of the subbands can be collected directly into a global histogram. (This approach also may be used to collect global histogram statistics supporting quantization settings based on normalizations other than $L^2$.)

Figure 4:
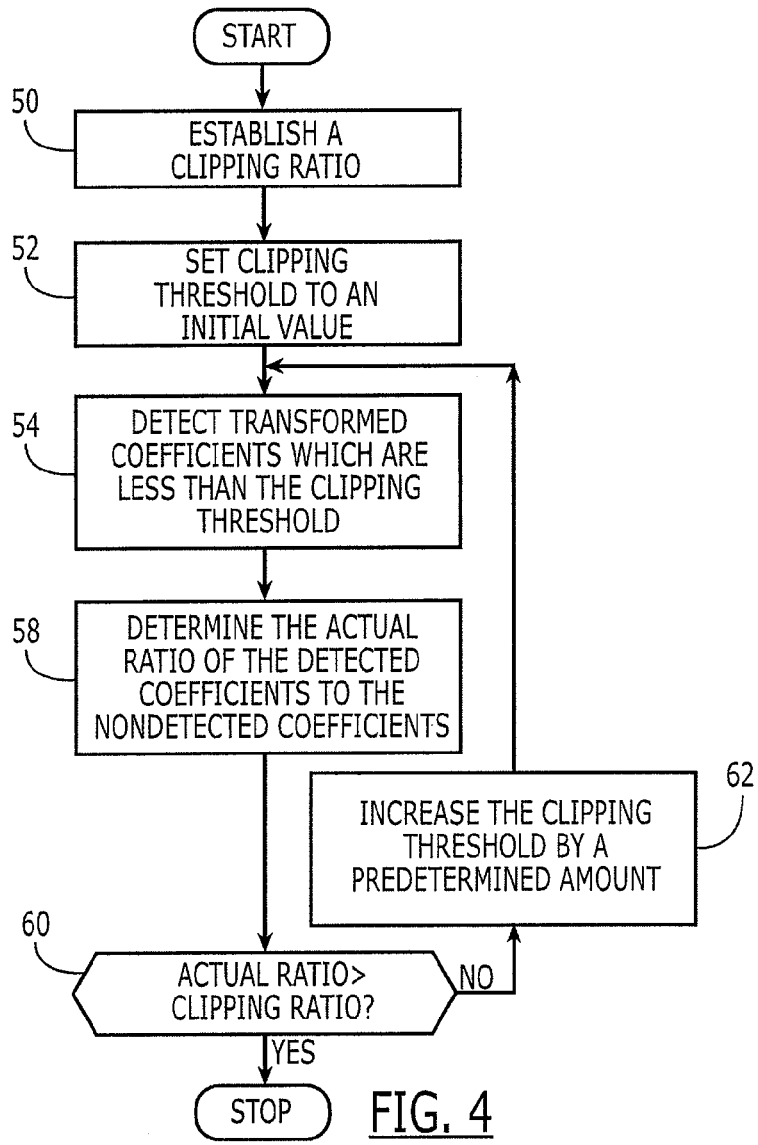
FIG. 4 is a flow chart illustrating operations for quantizing the transformed data.

The coefficient statistics and the target clipping ratio are together used to determine the clipping threshold as shown in block 32 of FIG. 2 and, in more detail, in FIG. 4. In particular, the clipping threshold T is initialized, such as to 1, as shown in block 52. By summing appropriate bins of the histogram which represent coefficient values that are less than the clipping threshold as shown in block 54, the count of insignificant coefficients which are less than the clipping threshold is determined and the resulting clipping ratio is computed as shown in block 58. A comparison of the actual and target clipping ratios can then be made as shown in block 60. If the actual clipping ratio is less than the target clipping ratio, the clipping threshold T can be incremented as shown in block 62 and the above-described process can be repeated. If the actual ratio equals or exceeds the target clipping ratio, however, the appropriate clipping threshold T has been determined. For implementations which maintain separate histograms for each subband, these histograms may be scanned in parallel, using a clipping threshold value for each respective histogram which is related to a global clipping threshold value in accordance with a scaling factor which accounts for differences in normalization of the subbands and optionally for perceptual weighting of the subbands.

Once the clipping threshold is determined, the significant coefficients which equal or exceed the clipping threshold may be processed separately from the insignificant coefficients as shown in block 33, and may be quantized as shown in block 34. Because the coefficient distribution is typically sharply peaked at zero as indicated in the stylized distribution of FIG. 5A, the insignificant coefficients (which will be reconstructed as zeros) are numerous and can be encoded very efficiently. In one embodiment, the insignificant coefficients are encoded by a combination of run length coding, as shown in block 36, and entropy coding, as shown in block 37. Note that encoding the insignificant coefficients by run lengths is equivalent to encoding the relative positions of the significant coefficients within the transform domain subbands.

Typically, a uniform quantizer is used such that all quantization intervals (other than the dead zone) are set equal to the nominal quantization interval Q, thereby minimizing RMS error. However, the data quantizer can quantize the transformed data non-uniformly without departing from the spirit and scope of the present invention.

Because the insignificant coefficients can be encoded very efficiently, it is advantageous to make the dead zone interval larger than the nominal quantization interval. In one embodiment, a uniform quantizer is used with a nominal quantization interval Q set equal to the clipping threshold T. This results in a dead zone interval of (−Q, +Q), which in fact is about twice as large as the nominal quantization interval. In this case, the quantization intervals to be applied to the coefficient magnitudes are given simply by $t_i = i*Q$. For purposes of illustration, a wider quantization interval centered about the origin is indicated in the quantized coefficient histogram depicted in FIG. 5B.

Figure 5A:
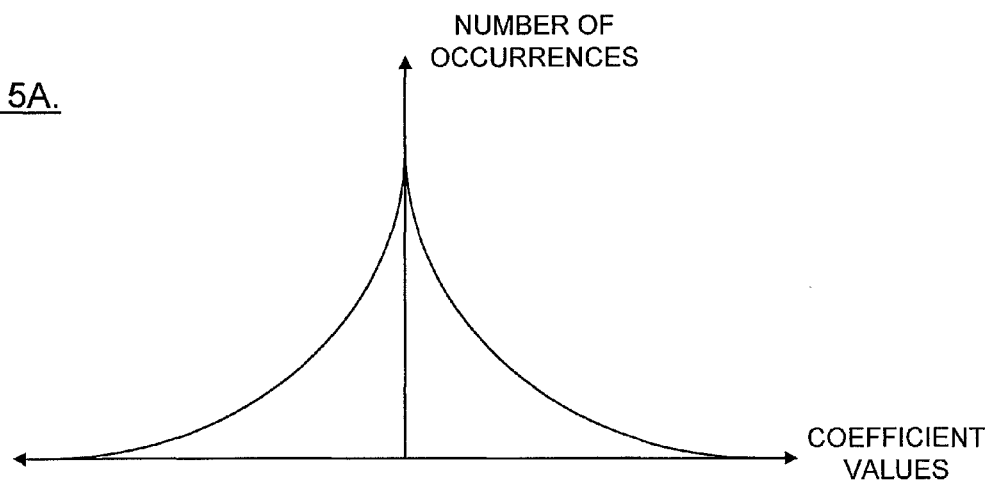
FIG. 5A is a sample distribution of wavelet transform coefficient values.

Due to the transformation and quantization processes described above, the quantized data can be approximated by a Laplacian distribution (i.e., a two-sided exponential distribution), a generalized Gaussian distribution, or other such distribution which is sharply peaked at the origin. A stylized representation of such a peaked distribution is shown in FIG. 5A for purposes of illustration since actual distributions are typically noisy and may be even more sharply peaked at the origin.

Once the transformed data has been quantized, the quantized significant coefficients can be encoded by the error resilient method and apparatus for encoding data as noted in block 35 of FIG. 2 and as described below. The insignificant coefficients can be run length coded to generate run length values which are thereafter entropy encoded using certain embodiments of the present invention or by another method, such as Huffman coding, Golomb coding, or arithmetic coding, as shown in blocks 36 and 37 of FIG. 2.

The data encoder 16 can encode both the quantized significant coefficients and their relative positions within the array of pixels to thereby increase the compression performance by eliminating explicit coding of each insignificant coefficient. The positions of the significant coefficients within the overall array of pixels can be encoded by a variety of methods, including coefficient maps, tree structures or run length coding. In one embodiment, the numerous insignificant coefficients are encoded by run lengths as shown in block 36. In run length coding, the number of insignificant coefficients which occur consecutively between two significant coefficients is specified, thereby effectively specifying the position of the second significant coefficient relative to the position of the first significant coefficient.

In some embodiments, both the run-length codes and the quantized significant coefficients are encoded using an entropy coding scheme. Entropy coding generally achieves a reduction in the number of bits required to represent a data set by assigning shorter code words to symbols which occur frequently and longer code words to symbols which occur less frequently. Consequently, symbols with similar probabilities of occurrence should be presented by code words with similar lengths, and because quantized coefficients with similar values typically share similar probabilities of occurrence as described above, they should also be represented by code words having similar code word lengths.

With traditional entropy coding approaches, the codebook is based on the raw empirical statistics of the data set to be encoded. Parametric entropy coders exploit the fact that the statistics of the data set to be compressed can often be effectively approximated by a mathematical or statistical distribution. For example, run length coding, wavelet and discrete cosine transforms, and linear and nonlinear predictive coding all produce data sets whose statistics can typically be approximated with Laplacian, exponential, or related distributions. For a parametric entropy decoder, the codebook may be defined with one to several parameters. These may be the parameters of an appropriate statistical distribution (from which the codebook is then generated) or may be the parameters which directly define the behavior of the entropy encoder (which imputes an appropriate statistical distribution). In either instance, a parametric entropy coding approach may provide faster adaptation to source statistics and/or a reduction in side information. These properties may be particularly beneficial The use of parametric entropy coding approaches based on Laplacian and related distribution models is supported by efforts to characterize the coefficient statistics for wavelet transforms and discrete cosine transforms of natural imagery, as reported in N. Tanabe and N. Farvardin, "Subband Image Coding Using Entropy-Coded Quantization Over Noisy Channels", *IEEE Journal on Selected Areas in Communications*, vol. 10, pp. 926-942 (June 1992), in K. A. Bimey and T. R. Fischer, "On the Modeling of DCT and Subband Image Data for Compression," *IEEE Transactions on Image Processing*, vol. 4, no. 2, pp. 186-193 (February 1995), and in R. L. Joshi and T. R. Fischer, "Comparison of generalized Gaussian and Laplacian modeling in DCT image coding," *IEEE Signal Processing Letters*, vol. 2, no. 5, pp. 81-82 (May 1995). These papers show that the coefficients resulting from wavelet and discrete cosine transforms may be effectively modeled using either Laplacian or generalized Gaussian distributions. Generalized Gaussian distributions are often used to model data sets which contain a mixture of several simpler independent distributions (such as Laplacian or Gaussian distributions). In fact, Joshi and Fischer observed in their paper that when the coefficients of the DCT are classified into blocks based on ac energy, then the coefficient data is more readily modeled by simpler Laplacian and Gaussian distributions than by generalized Gaussian distributions. As such, parametric entropy coding approaches may be used which are locally adapted based on Laplacian and related distributions.

In practice, the values for significant coefficients of the wavelet transform may be effectively modeled using a locally adapted Laplacian distribution model, which reduces to an exponential distribution when the sign is transmitted or encoded separately. Also, the positions for significant and insignificant coefficients may be represented by run length codes, whose distribution in turn may be modeled by an exponential distribution. Thus, Laplacian and exponential models are broadly useful for coding of wavelet-transformed imagery, and are similarly useful in combination with the discrete cosine transform.

For the Laplacian (two-sided) model, the approximation of the empirical distribution is represented by the random variable Y with probability distribution:

$$P(Y = y) = 0.5\lambda e^{-\lambda |y|} \quad (1)$$

where:

$$\lambda = \frac{1}{E[|Y|]} \quad (2)$$

wherein E[x] is the expected value of x, such as the mean value in some circumstances.

The associated exponential (one-sided) distribution (represented by the random variable X=|Y|) is given by:

$$P(X=x)=P(Y=|y|)=\lambda e^{-\lambda \cdot |y|}=\lambda e^{-\lambda x} \quad (3)$$

Thus, the Laplacian and exponential models can be handled in unified fashion, when the sign information for Laplacian-modeled data is signaled or coded separately, as discussed above. Another method of converting the two-sided Laplacian distribution to a one-sided distribution is to "fold" the distribution, producing a one-sided distribution which interleaves positive and negative values. This approach requires careful attention to handling of the zero bin and of sign information. In any case, there are a variety of methods for converting two-sided distributions to one-sided distributions. Thus, while the embodiments of the present invention are explicitly developed for coding data characterized by a one-sided distribution, these methods may readily be extended to handling signed (two-sided) distributions.

The discrete exponential distribution, obtained by quantizing the continuous distribution by a uniform quantization interval (i.e., N=X/Q), is given by:

$$P(N=n)=(1-e^{-\lambda Q})e^{-\lambda Qn}=(1-p)p^n=qp^n \quad (4)$$

For convenience, a simplified notation is provided above in terms of the transition probability $p=e^{-\lambda Q}$ (i.e., the ratio of probabilities for successive bins of the discrete distribution) and the base probability $q=1-p$ (i.e., the probability of the first bin of the distribution). This notation is also suited for modeling the statistics of run length coding. Specifically, for an independent and identically distributed binary source (with symbols A and B), the probability for a run of n consecutive occurrences of the symbol A followed by one or more occurrences of the symbol B is given by:

$$P(R=n)=(1-p)p^n=qp^n \quad (5)$$

where p is the probability for the occurrence of the symbol A and q=1−p is the probability for the occurrence of the symbol B. Thus, both run lengths and coefficient magnitudes may each be modeled using exponential distributions.

Figure 6A:
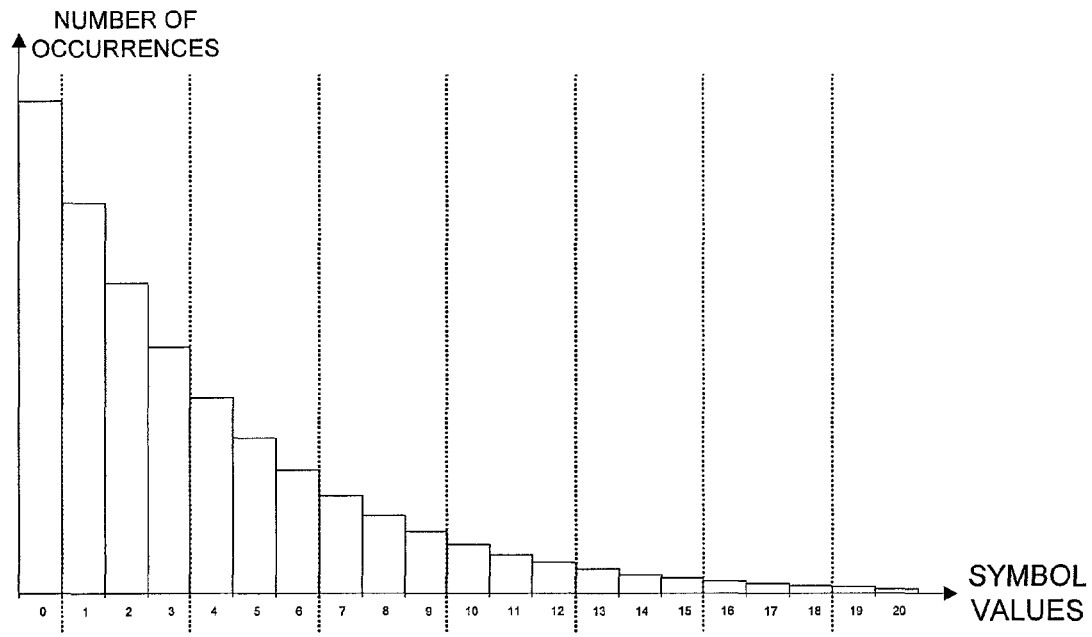
FIG. 6A depicts a partition of a notional symbol distribution for a Golomb parameter value of 3.
Figure 6B:
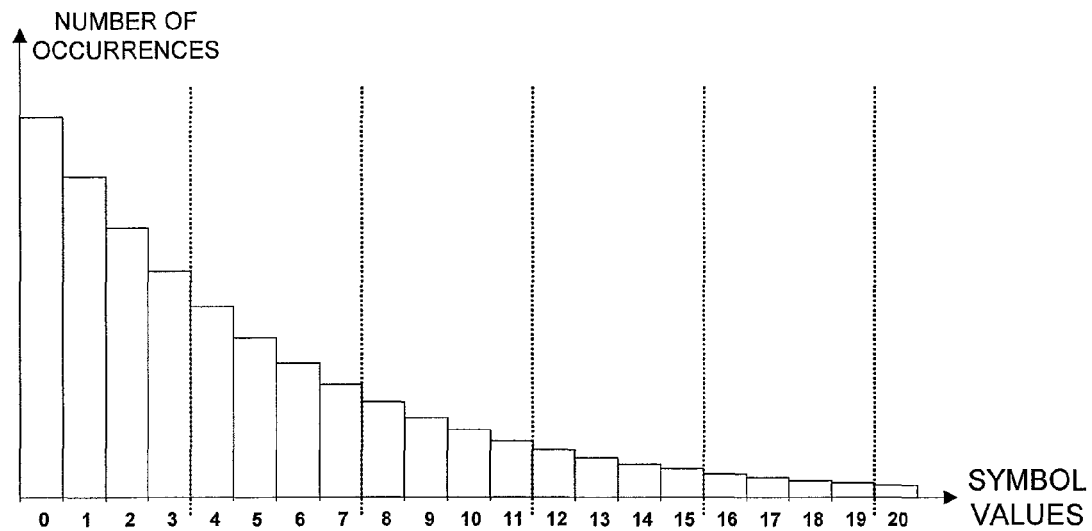
FIG. 6B depicts a partition of a notional symbol distribution for a Golomb parameter value of 4.

A well-known parametric coding approach for data modeled by the exponential or Laplacian distribution is Golomb-Rice coding (as described in the papers by Golomb and Rice referenced above). For this approach, the source distribution is partitioned into superbins, where a superbin is a set of adjacent bins whose code words all share the same code word length. The codebook can be characterized by a single parameter m, the so-called Golomb parameter, which is equal to the nominal superbin width. For Golomb coding, the Golomb parameter is a positive integer, while for Rice coding the Golomb parameter is constrained to be a power of 2 (which provides for simpler implementations at a typically slight cost in coding efficiency). This nominal superbin width applies to all superbins except for the first superbin (the superbin which includes the bin at the origin). By way of example, FIG. 6A and FIG. 6B depict partitions of notional symbol distributions for Golomb parameter values of 3 and 4, respectively.

Because the exponential source model is unbounded, a minimum redundancy code cannot be obtained by applying the Huffman coding procedure, which must start with the least probable symbol value. To form a code for this exponentially modeled source, a source value $n_1$ and a larger source value $n_2$ whose probability is exactly one-half of the probability for $n_1$ are first considered. This leads to:

$$P(N=n_2)=q2^{n_2 \log 2p}=0.5P(N=n_1)=0.5q2^{n_1 \log 2p}=q2^{-1+n_1 \log 2p} \quad (6)$$

which gives:

$$n_2 = n_1 - \frac{1}{\log_2 p} = n_1 + w \quad (7)$$

Since the source value $n_2$ has a probability equal to one-half the probability for $n_1$, the code word for $n_2$ is expected to be one bit longer than the code word for $n_1$. Furthermore, when the parameter $m=-1/\log_2 p$ is an integer (which it must be under the assumption that $P(R=n_2)$ is exactly equal to $0.5P(R=n_1)$), it can be further expected that the resulting code will partition the source distribution into superbins, with all of the bins in any superbin sharing the same code word length. For this code, each superbin (except possibly the first) will be comprised of m consecutive bins.

It can be shown that in order to minimize the average code word length for coding exponentially distributed data, the superbin widths for the first two superbins should sum to a power of two and furthermore that the first superbin should have the smallest width value that satisfies this constraint. Thus, when the nominal superbin width is equal to a power of two (i.e., $m=2^K$ with K being a non-negative integer), that width also applies to the first superbin. When the nominal superbin width is not equal to a power of 2 (i.e., $2^{K-1}<m<2^K$), then the width for the first superbin (which will be denoted by $m_0$) is less than the nominal superbin width (i.e., $m_0=2^K-m$).

Each code word in Rice-Golomb coding consists of a unary prefix and a binary suffix, which for a source symbol value n can be determined from a quotient Q and a remainder R, as follows:

$$Q = \left\lfloor \frac{n}{m} \right\rfloor \text{ and } R = n - Qm \quad (8)$$

The code word prefix consists of a unary code for the quotient Q. One type of unary coding represents an unsigned integer J using J bits consisting of (J−1) ones followed by a single zero bit which terminates the code. In instances in which the largest value to be represented by a unary code, such as JMAX, is known, the integer JMAX may be represented by (JMAX−1) ones with no terminating zero required to differentiate JMAX from larger integers. In instances in which the values to be represented by the code words are signed quantities, the prefix field can also include an extra or leading bit which designates the sign of the source symbol value represented by the code word.

If the nominal superbin width m is a power of two, then the suffix is the $\log_2 m$ bit binary representation of the remainder R. If m is not a power of two, then the suffix has a variable length, consisting of the $\lfloor \log_2 m \rfloor$ bit binary representation of R, if $R<2^{\lceil \log_2 m \rceil}-m$, or the $\lceil \log_2 m \rceil$ bit binary representation of $R+2^{\lceil \log_2 m \rceil}-m$, if $R \geq 2^{\lceil \log_2 m \rceil}-m$. Table 1 shows the first 16 entries of the codebook for several different values of the Golomb parameter.

TABLE 1

Sample Codebooks for Golomb and Rice Codes

| m = 2 | | | m = 3 | | | m = 4 | | | m = 5 | | |
|---|---|---|---|---|---|---|---|---|---|---|---|
| n | P(n) | Code | n | P(n) | Code | n | P(n) | Code | n | P(n) | Code |
| 0 | 0.293 | 00 | 0 | 0.206 | 00 | 0 | 0.159 | 000 | 0 | 0.129 | 000 |
| 1 | 0.207 | 01 | 1 | 0.164 | 010 | 1 | 0.134 | 001 | 1 | 0.113 | 001 |
| 2 | 0.146 | 100 | 2 | 0.130 | 011 | 2 | 0.113 | 010 | 2 | 0.098 | 010 |
| 3 | 0.104 | 101 | 3 | 0.103 | 100 | 3 | 0.095 | 011 | 3 | 0.085 | 0110 |
| 4 | 0.073 | 1100 | 4 | 0.082 | 1010 | 4 | 0.080 | 1000 | 4 | 0.074 | 0111 |
| 5 | 0.052 | 1101 | 5 | 0.065 | 1011 | 5 | 0.067 | 1001 | 5 | 0.065 | 1000 |
| 6 | 0.037 | 11100 | 6 | 0.052 | 1100 | 6 | 0.056 | 1010 | 6 | 0.056 | 1001 |
| 7 | 0.026 | 11101 | 7 | 0.041 | 11010 | 7 | 0.047 | 1011 | 7 | 0.049 | 1010 |
| 8 | 0.018 | 111100 | 8 | 0.032 | 11011 | 8 | 0.040 | 11000 | 8 | 0.043 | 10110 |
| 9 | 0.013 | 111101 | 9 | 0.026 | 11100 | 9 | 0.033 | 11001 | 9 | 0.037 | 10111 |
| 10 | 0.009 | 1111100 | 10 | 0.020 | 111010 | 10 | 0.028 | 11010 | 10 | 0.032 | 11000 |
| 11 | 0.006 | 1111101 | 11 | 0.016 | 111011 | 11 | 0.024 | 11011 | 11 | 0.028 | 11001 |
| 12 | 0.005 | 11111100 | 12 | 0.013 | 111100 | 12 | 0.020 | 111000 | 12 | 0.025 | 11010 |
| 13 | 0.003 | 11111101 | 13 | 0.010 | 1111010 | 13 | 0.017 | 111001 | 13 | 0.021 | 110110 |
| 14 | 0.002 | 111111100 | 14 | 0.008 | 1111011 | 14 | 0.014 | 111010 | 14 | 0.019 | 110111 |
| 15 | 0.002 | 111111101 | 15 | 0.006 | 1111100 | 15 | 0.012 | 111011 | 15 | 0.016 | 111000 |

In the examples above, only those cases for which the Golomb parameter is a power of 2 are relevant to Rice coding.

In practice, the estimated values for the probabilities p and q=1−p will typically indicate a non-integer value for the nominal superbin width $m=-1/\log_2 p$ (or a non-power of 2 value in the case of Rice coding). In those situations, the minimum redundancy Golomb codebook will have superbins which oscillate between superbin widths of $\lfloor -1/\log_2 p \rfloor$ and $\lfloor -1/\log_2 p \rfloor +1$. Similarly, the minimum redundancy Rice codebook will have superbins which oscillate between superbin widths of $2^K$ and $2^{K+1}$, where $K=\lfloor \log_2(-1/\log_2 p) \rfloor$.

If the code implementation requires that the same nominal superbin width be maintained for all superbins (except possibly for the first superbin), then minimum redundancy is obtained not by choosing the integer (or power of 2) value for the Golomb parameter m which is nearest to $-1/\log_2 p$, but the integer (or power of 2) value for m which results in the smallest expected average code word length for the Golomb or Rice code. Due to a simple relationship between the transition probability p and the mean $\mu$ of the exponential distribution (i.e., $\mu=p/(1-p)$), it is possible to directly determine the appropriate setting for the Golomb parameter directly from the mean (which is estimated from the source data). For the Golomb code, it can be shown that the appropriate integer setting for the Golomb parameter m can be estimated accurately as a function of the estimated mean $\hat{\mu}$ of the source, using the following piecewise linear approximation:

$$\hat{m} \approx \lfloor 0.69315 \cdot \hat{\mu} - 0.15312 \rfloor = \lfloor 0.69315 \cdot \hat{\mu} + 0.84688 \rfloor \quad (9)$$

For the Rice code, it can be shown that the appropriate power of 2 setting for the Golomb parameter m can be estimated very accurately as a function of the estimated mean $\hat{\mu}$ of the source, using the following piecewise linear approximation:

$$\hat{m} \approx 2^K \text{ where } K = \lfloor \log_2(0.48121 \cdot \hat{\mu} + 0.23834) \rfloor \quad (10)$$

These relationships for determining the Golomb parameter as a function of the estimated distribution mean $\hat{\mu}$ are based on an exponential distribution model in which the smallest and most probable symbol value is 0. For exponential distribution models which start with a symbol value of 1 (or more generally, with an integer L), the Golomb parameter may be computed by substituting $(\hat{\mu}-1)$ (or more generally $(\hat{\mu}-L)$) for $\hat{\mu}$ in the equations above.

It can be shown that the asymptotic growth of the code word length for the Golomb and Rice code is an exponentially increasing function of the symbol value. This can lead to very long code words when unexpectedly large symbol values occur. Such large symbol values may arise due to nonstationary sources, or when the source statistics depart from the Laplacian/exponential model. To deal with such issues, some variations of Golomb and Rice coding may allow for systematic increases in the superbin width for large symbol values. Increases in the superbin width may be intrinsic to a particular coding method, as with the start-step coding method described below, or may be implemented by an "escape" mechanism which departs from the normal Rice-Golomb coding procedure when the symbol value or the superbin number exceeds a specified threshold. Such strategies can prevent excessively long code words by reducing the asymptotic growth of the code word length to only a linearly increasing function of the symbol value.

According to embodiments of the present invention, an entropy encoder 16 and, more preferably, code word generating means 26 generates a plurality of code words which are representative of the positions and quantized values for the significant coefficients. Accordingly, the plurality of code words effectively represents the quantized image data. Each code word which represents a quantized coefficient value includes at least a first portion (hereinafter termed a "prefix field") and preferably an associated second portion (hereinafter termed a "suffix field"). Accordingly, the code word generating means may include a prefix generating means 27 for generating the prefix field of each code word and a suffix generating means 28 for generating the associated suffix field of each code word, as shown in block 38 of FIG. 2. Since each code word is preferably formed of two fields, namely, the prefix field and the suffix field, this method of coding will be termed split field coding. According to the method of one embodiment of the present invention, the suffix fields will be generated in a fashion which provides resilience to errors on said suffix fields, so that the suffix fields may be handled separately from the prefix fields and used advantageously for purposes such as providing a partially embedded bitstream. As will be apparent to those skilled in the art, the split field coding method described below is not useful only for coding of quantized coefficient values, but may be applied to symbols from a wide variety of data sources.

For the exemplary embodiment of the compression process described in U.S. Pat. No. 5,850,482 to James J. Meany, et al., the code words are generated in accordance with a variation of the start-step coding method proposed in E. R. Fiala and D. H. Greene, "Data Compression with Finite Windows," Communications of the ACM, Vol. 32, No. 4, pp. 490-505 (1989). Rice coding is, in fact, a special case of start-step coding, using a Golomb parameter $m=2^K$, with K=START and STEP=0. Start-step coding generalizes Rice coding by defining systematic increases to the superbin width. Thus, the width for superbin i is given by:

$$m_i = 2^{K_i} \text{ where } K_i = \text{START} + i \cdot \text{STEP} \tag{11}$$

where START, STEP, i, and K are all non-negative integers. As known to those skilled in the art, a variety of coding methods, besides the Rice and start-step coding methods described above, may be used to generate code words which may be separated into prefix and suffix portions, and are thus suitable for use within the framework of embodiments of the present invention.

According to split field coding, the prefix field may have a variable length and includes information representative of the associated suffix field, while the suffix field associated with the prefix field has a length which may be variable, but which is known given the current state of the codebook and the associated prefix field. More specifically, the prefix field may include information representative of the contiguous or consecutive range of symbol values which the associated suffix field of the code word may represent. Furthermore, the suffix field includes information representative of the respective symbol value from within the contiguous or consecutive range of symbol values designated by the prefix field, typically encoded according to a predetermined or dynamically adapted codebook.

Typically, each suffix field is associated with a corresponding prefix field and is formed by a number of characters, such as a number of bits, with the number of characters being determined according to a predetermined or dynamically adapted codebook. In accordance with the current codebook state, the number of characters which form the suffix fields may be fixed (as for Rice coding or for start-step coding with STEP=0), or may be variable. A variable number of characters for the suffix fields may arise in a variety of circumstances. For example, the number of characters in the suffix fields may be variable due to explicit parameters of the coding method (as for start-step coding with STEP>0), due to oscillation of the superbin width between two values (as per Rice coding with a nominal Golomb parameter not equal to a power of 2), or due to strategies for systematic increase in the superbin width to prevent exponential growth in codeword length as a function of symbol value (as discussed above). Whether the number of characters for the suffix fields is fixed or variable, the number of characters for a specific suffix field is known given the associated prefix field, with said number of characters being the number required to provide specification of the respective symbol value within the contiguous or consecutive range of symbol values designated by the prefix field.

Figure 5B:
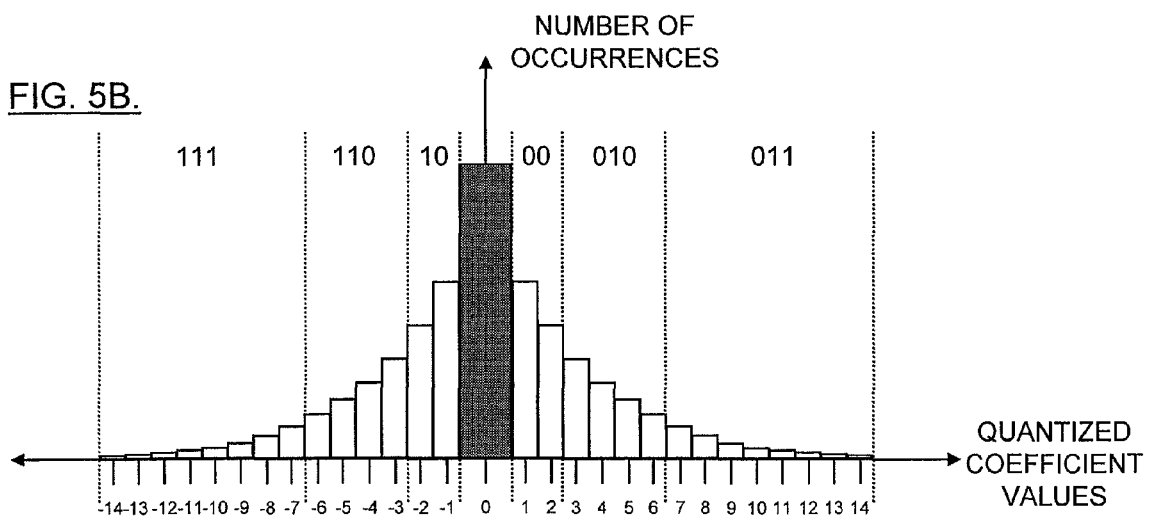
FIG. 5B is a histogram illustrating the relative frequency of occurrence of exemplary quantized data values.

The decorrelating properties of the wavelet transform generally result in a distribution of coefficient values which is typically sharply peaked at zero and which decays more or less monotonically away from the peak at zero as depicted in FIG. 5A. This type of distribution dictates that similar coefficient values typically have similar probabilities or frequencies of occurrence. As noted previously, the quantizer 14 maps all coefficients whose values fall within a particular interval to a particular discrete symbol. The statistics of the quantized coefficients can be characterized using a "histogram" of the resulting discrete symbol values which is a distribution consisting of individual bins representing the frequency or probability of occurrence of the respective discrete symbol values. Each bin is associated with a particular quantization interval and has a frequency defined by a count of the number of occurrences of quantized coefficients whose values fall within the associated quantization interval. A stylized representation of a quantized coefficient histogram is depicted in FIG. 5B. Because the counts within the histogram are dependent upon the original coefficient distribution, the histogram also demonstrates that bins which represent coefficients having similar values will typically have similar counts or probabilities of occurrence. As noted above, histograms of this form may be effectively approximated using a Laplacian distribution model and may be suitably encoded using methods such as Rice coding or start-step coding.

According to one embodiment of the present invention, the prefix field includes information representative of a specific set of $2^K$ consecutive histogram bins of the discrete symbol histogram which are, in turn, associated with a corresponding set of $2^K$ consecutive quantized coefficient values. The associated suffix field shall consist of K bits, with said suffix field having $2^K$ possible values, which will each be associated by one-to-one correspondence with the $2^K$ consecutive bins which are designated by the respective prefix field. In the aggregate, the prefix and suffix field of each code word shall together include information representative of a specific symbol, associated with a specific bin of the discrete symbol histogram. Accordingly, the histogram shall be partitioned into sets of consecutively occurring bins (which we have designated above as superbins). Each superbin is, in turn, associated with a unique value of the prefix field, while the individual bins of the superbin are indexed by the $2^K$ possible values of the associated suffix field.

The prefix field, by virtue of including information representative of a specific set of $2^K$ consecutive histogram bins to be indexed by the associated suffix field, implicitly designates information representative of the number of bits K in the suffix field, with the value K being either fixed or variable in accordance with the current codebook. For example, the number of bits in the suffix field may be fixed in accordance with Rice coding or in accordance with start-step coding with STEP=0, or the number of bits in the suffix field may be variable in accordance with start-step coding with STEP>0.

FIG. 5B shows the partitioning of an exemplary quantized coefficient histogram into superbins, i.e., the dotted lines indicate the bounds of the superbins. It will be apparent, however, that the histogram can be partitioned in other manners without departing from the spirit and scope of the present invention. Accordingly, the partitioning of the exemplary histogram of FIG. 5B into superbins is depicted and discussed for purposes of illustration and not limitation.

The central bin (shaded) of the exemplary histogram corresponds to the insignificant coefficients (quantized to zero). Within the present embodiment, the indication of coefficient significance is signaled separately, such as by run length coding, followed by entropy coding. Thus, the insignificant coefficients are not directly encoded as quantized coefficient values and are therefore not included in any superbin. On either side of the central bin, the histogram illustrates a superbin consisting of two bins. These superbins would preferably each be associated with a suffix field having a length of 1 bit which is sufficient to distinguish the 2 individual bins of the superbin. The histogram in FIG. 5B also shows superbins with widths of 4 and 8 bins which may be associated with suffix fields having lengths of 2 and 3 bits respectively, so as to distinguish the individual bins within each of the superbins. Above each superbin, a code is shown, consisting of a leading bit indicating the sign of the coefficient value, followed by a unary prefix code which designates the superbin.

The prefix generating means 27 can generate the prefix fields in a variety of manners, such as entropy coding as noted in block 39 of FIG. 2 and, in one embodiment, by unary coding. Each possible value for the prefix field can be associated with a respective suffix field having a predetermined number of characters. The suffix generating means 28 can generate the suffix fields in a variety of manners, but, in one embodiment, the suffix fields are represented by binary integers of length K. In this embodiment, each possible combination of the K bit suffix field is associated with one of the $2^K$ bins which form the superbin designated by the associated prefix field. For example, the two and three bit integers shown over the superbins in the histogram of FIG. 5B represent the prefix field codes for the respective superbins. The most significant bit is a sign bit, while the remaining bits are a unary code which specifies the respective superbin. As described above, the associated suffix fields for the superbins of width 2, 4, and 8 bins consist of 1, 2, or 3 bits, respectively. Note that the code words associated with each superbin all share the same code word length. As previously noted, the bins for similar valued coefficients typically have similar counts or probabilities of occurrence, so that the proposed codes can result in efficient codes by assigning common code word lengths to coefficients with similar probabilities.

The exemplary histogram in FIG. 5B could be encoded using a start-step code with parameters START=1 and STEP=1, augmented by a leading bit to indicate coefficient sign. The unary prefixes for the outermost superbins in this example omit a terminating zero bit since it is would not be required for differentiating against larger superbins. As an example, the symbol value −9 would fall into the superbin associated with the prefix "111" and would require a 3 bit suffix field of "010" to index bin number 2 from among eight individual bins with indices 0 to 7. Thus, the resulting codeword would be "111010".

Figure 9:
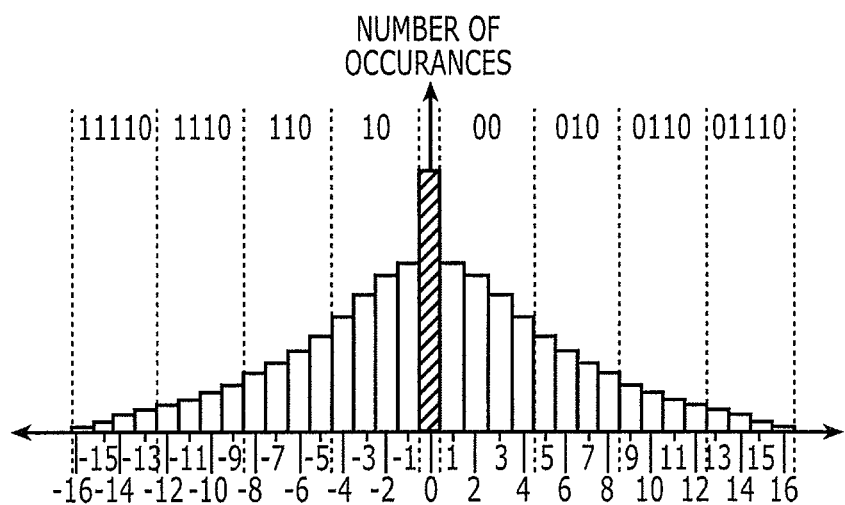
FIG. 9 is a histogram illustrating another example of the relative frequency of occurrence of certain quantized data values.

Another example of split field coding applied to a simple histogram of signed coefficients is shown in FIG. 9. As in the previous example, the central (shaded) bin represents insignificant coefficients which are quantized to zero, and are not directly included in the code of quantized coefficient values. The code represented in this histogram could be encoded using a start-step code with parameters START=2 to indicate a nominal suffix field length of 2 bits required to encode a nominal superbin width of 4 and STEP=0 to indicate that the superbin width is constant. Alternatively, this histogram could be encoded using a Rice code with K=2 which leads to the superbin width $m=2^K=4$. For this example, the prefix fields for the outermost superbins do not omit a terminating zero bit which indicates that the histogram may have additional unshown outer bins and that the associated code may represent a range of values which is unbounded.

For this example, the symbol value −5 would be encoded as "11000", starting with a "1" to indicate a minus sign, followed by the unary code of "10" to indicate the appropriate superbin, and finally a suffix of 00 to index the bin within the superbin. The symbol value +11 would be encoded as "0111010", starting with a "0" to indicate a plus sign, followed by the unary code of "1110" to indicate the appropriate superbin, and finally a suffix of 10 to index the bin within the superbin.

The codebooks for split field coding may be estimated based on either previously coded symbol values (i.e., backward adaptive coding, as described above), or yet-to-be coded symbol values (i.e., forward adaptive coding, as described above), or may make use of a static codebook (i.e., static coding, as described above). The codebook estimation may be performed in a variety of fashions in accordance with the underlying code word generation method. For example, if the code words are generated in accordance with Rice coding, then the codebook may be determined using the Golomb parameter m (i.e., the superbin width) computed using Equation (10) above, a piecewise linear function of the estimated mean $\hat{\mu}$ of the source. The mean value $\hat{\mu}$ may be estimated either recursively (for backward adaptive coding), over a sliding window (also for backward adaptive coding), or over a block of coefficients to be coded (for forward adaptive coding). Also, it is possible to compute mean estimates using only fixed point arithmetic.

Alternatively, the codebook may be estimated using a greedy search procedure applied to a histogram of sampled symbol values (either previously processed or yet-to-be processed symbols). For Rice coding, this greedy search would be initialized with a candidate value for the K parameter set so that the first superbin (consisting of $2^K$ bins) contains approximately half of the total population of the histogram. This is consistent with the fact that the unary code for the prefix field on the first superbin has a length of 1, imputing a probability of 0.5 for the first superbin. To further optimize coding performance, adjacent values for K may be evaluated and if they do not yield a reduction in the estimated number of code bits, then the search is concluded.

This greedy search procedure may also be extended for use with start-step coding. In that case, the candidate value for the START parameter is initialized in the same manner as K above (i.e., so that the first superbin of $2^{START}$ bins contains approximately half of the total population of the histogram). The STEP parameter is then chosen to minimize the estimated number of code bits, given the selected value for the START parameter. In this regard, empirical results have shown that only STEP values between −1 and +2 need be considered, so that this process is not expensive. To further optimize coding performance, adjacent values for START may be evaluated and if they do not yield a reduction in the number of code bits, then the search is concluded. In this regard, it is noted that an evaluation of the candidate START values may include a determination of the best accompanying STEP value.

A special case to be considered in the formation of the codebook is when the distribution is flat enough that all coefficients should be the same length. In that case, there is no unary code in the prefix and all code words are the same length; sometimes consisting only of a sign bit for the case where all the coefficients are +1 or −1.

To preserve the error resilience properties for the suffix fields in split field coding, it is essential that errors on the suffix fields not destroy the synchronization of the codebook between the encoder and decoder. This is not an issue for forward adaptive coding or static coding, since in those cases the codebook is either known a priori or is conveyed by explicit side information transmitted from the encoder to the decoder. In the case of backward adaptive coding, the estimation of the codebook should not be dependent on any suffix field data which is separated from the prefix fields (and is thus to be treated as error resilient data subject to a higher probability of errors). The estimation of the codebook in the absence of suffix field information may exploit the assumption of an exponential distribution model of the source data. Thus, for codebook estimation processes which make use of a histogram, the bins within a histogram should be filled with descending counts for the individual bins to approximate the exponential distribution characteristic. Similarly, when using codebook estimation based on the estimates of the mean, the updates to the mean estimate may replace the actual symbol values with values which are the mean of the corresponding superbin. Other codebook estimation methods can be defined which may adjust the codebook in accordance with coding performance, for example, ensuring that approximately half of the samples fall into the first superbin with the remaining half falling into outer superbins. Such schemes are not dependent upon the knowledge of the suffix field information.

The codebook estimation processes for split field coding are quite fast. Codebook estimation methods based on a function of the estimated mean are computationally simple. The greedy search methods are efficient because only a few discrete combinations of the codebook parameters must be evaluated. The encoding and decoding processes may also be quite fast because the parametric nature of the code eliminates the need for handling tree or table data structures to explicitly represent the codes for each symbol. Split field coding methods also provide very efficient performance for coding transform coefficients of signal and image data, typically coding at very close to the entropy. This coding efficiency stems from at least two factors: (1) the statistical distributions imputed by split field coding are well-matched to the data, and (2) the parameters specifying the split field code add minimal side information to the bitstream (or provide rapid adaptation in the case of backward adaptive coding).

In summary, the prefix field may include information representative of a specific characteristic of the associated suffix field, such as the contiguous or consecutive range of coefficient values or bins which the associated suffix field of the code word may represent, wherein the contiguous or consecutive range corresponds to a superbin. Furthermore, the prefix field may also include information representative of another characteristic of the associated suffix field, such as the number of characters which form the associated suffix field of the code word. In addition, the suffix fields include information representative of respective portions of the original data, such as specifically designating an individual bin within a superbin.

Consequently, if the prefix field of a code word is decoded correctly, that is, without the occurrence of any errors, then the method and apparatus of certain embodiments of the present invention can correctly determine the length of the associated suffix field and can also correctly determine the range of coefficient values to be represented by the associated suffix field. As a result, the associated suffix field will exhibit resilience to errors in two respects. First, any errors resulting in partial or total loss of the bits within the associated suffix field shall not result in a loss of code word synchronization but, rather, the effects of those bit errors shall be isolated to that single code word. Second, the misdecoded coefficient value resulting from partial or total loss of the bits within the associated suffix field shall be constrained to that contiguous range of coefficient values represented by the prefix field which corresponds to the range of the associated superbin.

The error mechanisms to which suffix fields are resilient include corruption of bit values, truncation of the bitstream (for which all bits after the truncation point are lost), and erasure errors (where a bit is dropped). With a corrupted bit, only the associated suffix field will be affected. In the event of bitstream truncation or an erasure error, all suffix fields starting from the point of the error will be affected. In the event of any of these error mechanisms, a suffix field may be partially or completely corrupted, but even with complete corruption, the decoded value will still fall within the associated superbin, thus preserving code word synchronization and limiting the amount of distortion on the decoded value.

Thus, the information represented within the prefix field of a code word may be correctly decoded even when the associated suffix field is subject to errors. This information represented by the prefix field specifies a contiguous or consecutive range of values (i.e., the superbin) for the encoded symbol value. By way of contrast, the information represented within the suffix field of a code word may not be correctly decoded when the associated prefix field is subject to errors. If the suffix fields for the current codebook have variable lengths, then errors on the prefix fields will result in a loss of synchronization with the suffix fields. Even with fixed suffix field lengths, if there are any errors on the prefix field of a codeword, then the information representative of a specific encoded symbol value included in the associated suffix field may not be correctly decoded.

Accordingly, it may be advantageous to provide mechanisms within the formation and handling of the compressed bitstream, such as by means of the progression priority sequencing means 29 of the data encoder 16 of FIG. 1, which provide more protection of prefix fields relative to the corresponding suffix fields. Thus, the separation of the prefix fields from the suffix fields permits the prefix fields to be afforded greater protection either by earlier placement within an encoded bitstream or by more elaborate methods, such as employing varying levels of error correction coding for the prefix and suffix fields.

In addition to separating a code word into a prefix field and a suffix field, as in accordance with an entropy coding technique such as described in U.S. Pat. No. 5,850,482 patent, the suffix fields of the code words may also be further subdivided in accordance with embodiments of the present invention. In this regard, a plurality of bitplane blocks may be defined with each block including one or more bitplanes extracted from certain of the suffix fields. We shall refer to these bitplane blocks as bitblocks. See block 38 of FIG. 2. In this regard, a bitplane is the set of bits having the same significance position within each of the suffixes within a given subband of the transform of a given image plane. A bitplane may also refer to a set of bits having the same significance position within each of the suffixes of a spatial subset of a given subband (i.e., a precinct or codeblock, as defined in the terminology of embedded coding above). Notationally, we may denote bitplane A.B.C.D as the bitplane comprising the bits from significance level D from the encoded suffixes for quantized coefficients within precinct C of subband B of the transform of image plane A. It will be apparent to those skilled in the art that bitplanes can be subdivided, differentiated, and/or aggregated in accordance with other considerations such as orientation of subbands, region of interest designations, or other criteria as dictated by the application.

While each bitblock may be defined to include a single bitplane, the bitblocks may also be defined such that at least some of the bitblocks include multiple bitplanes. Typically, the multiple bitplanes included within a single bitblock would be consecutive bitplanes from the suffixes within a specific precinct, such as one bitblock including bitplanes two and higher and another bitblock including bitplanes zero and one. Combining multiple bitplanes within a common bitblock may offer advantages of simplified buffering of bitblocks for some applications. However, in the absence of such benefits, it is generally preferable to not combine multiple bitplanes within a bitblock as this will coarsen the granularity of the progressive coding.

The bitblocks are generally defined such that each bitblock differs from another bitblock by including a different bitplane that is not included in any other bitblock. For efficiency purposes, each bitplane is generally included in at least one bitblock, but is not generally included in more than one bitblock.

Within each bitblock, the information may be interleaved. For example, a bitblock that includes multiple bitplanes may interleave the information for all of those bitplanes. For example, if a bitblock includes bitplanes one and zero, the bits from bitplane one and zero from the same suffix field may occur consecutively, followed by the bits from bitplane one and zero from the next suffix field, and so on. However, each bitblock is generally maintained distinct from the other bitblocks with no interleaving of information between the bitblocks.

As with progressive coding schemes described above (such as within the JPEG 2000 standard), it may be convenient to generate and sequence the bitplanes and the associated bitblocks by a two stage or two tier process. For example, in one embodiment of the present invention, the encoding of the data as well as the associated separation of the suffix bitplanes and the aggregation of those bitplanes into appropriate bitblocks is performed during tier 1 processing, while the sequencing of the bitblocks in accordance with a prescribed progression priority is performed during tier 2 processing. In other embodiments, the tier 1 processing would include the encoding of the data, while the tier 2 processing would include the separation of the suffix bitplanes, the aggregation of those bitplanes into appropriate bitblocks, and the sequencing of the bitblocks in accordance with the applicable progression priority. In general, it is not feasible within a single tier or stage of processing to directly generate the encoded data in accordance with the sequence dictated by an arbitrary progression priority because the sizes of the individual bitblocks (and thus the positions for the sequential bitblocks within the progression) are not known prior to encoding. Typically, it is advantageous to perform the separation and aggregation of the suffix bitplanes during tier 1 processing. This is due to the fact that separation of the suffix bitplanes requires knowledge of the full coding context in which the codewords are generated. This context is known and available during tier 1 processing. Performing the separation during tier 2 processing would require recovery of the coding state which would in turn require repeating much of the computation of the original coding process.

In one embodiment of the present invention, the sequencing of bitblocks is performed in accordance with a prescribed progression priority scheme which may be defined by the user or fixed for the application. For the purposes of such sequencing, each bitblock may be denoted by a multi-element index such as A.B.C.D (as described above), with each element of the index associated with a corresponding progression aspect, such as image plane, resolution subband, spatial location, and bitplane significance, and with the index element values respectively signifying placement of the bitblock within the corresponding progression aspect. For bitblocks which include multiple bitplanes, the bitblock may be indexed in accordance with the most significant bitplane included in the bitblock.

Each element of the bitblock index may be associated with a range of numeric values defined with respect to progression priority within the corresponding progression aspect. For example, the subband index element may be numbered in accordance with the resolution level of the subband, the spatial location element in accordance with spatial coordinates, the plane element in accordance with numbering of image planes, and the significance element in accordance with the bitplane numbers. The orientation of subbands may be represented either within a separate index element, or may be combined in some fashion with resolution information in the subband index element. The spatial location element may be subdivided into two components to account for vertical and horizontal spatial coordinates.

The assignment of numeric values to the elements of the bitblock indices may maintain correspondence with the preferred progression priority of the bitblocks within the corresponding progression aspect, with higher numeric values signifying higher progression priority or importance. Thus, for example, larger resolution element values may be assigned to bitblocks at coarser resolutions and larger significance element values may be assigned to bitblocks associated with more significant bitplanes. The particular assignment of numeric values to the bitblock indices is highly flexible, so that different schemes for assigning values will produce identical results from the standpoint of establishing progression priority, provided that the schemes define mappings between the element values and the relative progression priorities which are ordinally identical. By way of example, the significance elements of the bitblock indices could be assigned numeric values in accordance with the weighting of the bitplanes, which for the binary values of the suffix fields are weighted according to powers of 2. Alternatively, these significance elements may be assigned numeric values in accordance with the log (base 2) of the bitplane weighting, which would result in integer values corresponding to the bitplane numbers. Since the relationship between the bitplane weights and the logarithm of the bitplane weights is monotonic, these two assignment schemes would result in identical progression priorities.

The numeric values for the significance index elements in particular are typically associated with the priorities of quality progressions. Thus, these values may be assigned in accordance with the contributions of the associated bitblocks to the total distortion in the reconstructed image. Accordingly, a significance element value may be determined in accordance with all factors which affect how the associated bit block contributes to the overall distortion measure. These factors typically may include the bitplane significance, the normalization of the associated resolution subband, the distortion weighting of the associated spectral or color plane, and the choice of distortion measure. Thus, the significance element value may be computed as a product of distortion weighting factors, or equivalently as the sum of the logarithms of these weighting factors, or by an alternate scheme which maintains the equivalent ordinal relationships.

The individual bits of a suffix field are weighted by powers of 2 and the distortion contributions of the respective bitplanes are weighted accordingly. Thus, for most commonly used distortion measures, the distortion weighting due to bitplane significance is simply the weight of the bitplane, which is a power of 2 (or alternatively in a sum of logarithm scheme, the log base 2 of the bitplane weight, which results in an integer value).

As discussed in the background section above, when the distortion measure is mean squared error (or equivalently RMS error), then the transform coefficients within the subbands of the wavelet transform contribute to the distortion in accordance with an $L^2$ normalization. Thus, when a subband is $L^2$ normalized (and the distortion measure is RMS error or an equivalent), no subband-related adjustment is required to the distortion weighting of the associated bitblocks. Conventional wavelet transform implementations, such as the lifting scheme, utilize fixed point computations resulting in wavelet coefficients which are not $L^2$ normalized. With these implementations, the normalizations of individual subbands are related to the $L^2$ normalization by scaling factors, which for convenience will be referenced as normfactors. With the lifting scheme and other popular implementations of the wavelet transform, these normfactors are typically integer powers of 2. Specifically, the subbands resulting from the lifting scheme are attenuated by various power of 2 normfactors in order to reduce the dynamic range of the coefficient values (while preserving perfect reconstruction within the transform). Thus, the appropriate distortion weighting factor for a particular subband is the inverse of the corresponding normfactor. Alternatively, within a sum of logarithm scheme, the contribution due to the subband will be the negative logarithm of the normfactor (which will be an integer whenever the normfactor is a power of 2).

The distortion weighting factors due to spectral or color plane are determined by the definition of the distortion measure within the applicable color space or spectral domain. For example, in color spaces which isolate chrominance from luminance, the distortion weighting typically weights the chrominance image planes as less important than the luminance image plane. As above, these distortion contributions may apply as the product of the actual weighting factors, or as the sum of the logarithms of the weighting factors.

This approach may be used with a variety of distortion measures, such as perceptual distortion measures such as structural similarity. Similarly, the subband contributions of the distortion measure may be weighted to account for the contrast sensitivity function of the human visual system, or the color space weighting of the planes may be weighted to account for human color perception.

Distortion measures may also be spatially weighted, which will have the effect of placing higher or lower priorities on different regions of interest within the image, and accordingly affecting the progression sequence. Finally, distortion measures may be employed to highlight particular spectral or color bands, or to emphasize particular resolution subbands, which could be used to produce filtering of spatial frequencies in the reconstructed image.

For the purpose of progressive sequencing, the prefix fields of coefficients and the associated coefficient position information (typically represented by entropy encoded run lengths) may be treated as bitblocks indexed identically to the corresponding suffix fields from the standpoint of image plane, subband (resolution), and spatial location, but having higher bitplane levels. Specifically, the prefix field bitblocks should have a higher bitplane level assignment than the associated suffix field bitblocks, while the coefficient position bitblocks should have an even higher bitplane level assignment than the associated prefix field bitblock (or be else included within those same bitblocks). This treatment will ensure that progressive sequencing of bitblocks containing prefix fields will be given higher priority than the associated suffix fields since the decoding of the suffix fields depends upon the correct decoding of the associated prefix fields. Furthermore, providing the highest significance level assignment to bitblocks containing coefficient position information ensures that the decoded coefficients can be placed at the proper positions within the transform domain (where misplacement would result in high levels of distortion).

In one embodiment, a progression priority scheme may be defined in terms of numeric weighting factors associated with the individual progression aspects, with higher priority progression aspects being assigned larger weights. In this regard, the lowest priority progression aspect may be assigned a small weighting factor (such as a value of one), with higher priority progression aspects assigned correspondingly larger weighting factors. The sequencing of bitblocks may then be performed in accordance with a priority value determined for each bitblock, with the priority value being the sum of the bitblock index elements weighted by the corresponding weighting factors. Within this framework, the choice of appropriate weighting factors may produce a desired progression priority scheme. A negative weighting factor may be used to cause the associated progression aspect to be iterated in reverse sequence. This characteristic can be useful in causing a spatial progression to iterate from bottom to top rather than from top to bottom, or from right to left rather than from left to right, for example.

Typically, progression priority schemes are chosen to be independent, which means that the bitstream shall sequence through the full range of lower priority progression aspects for each individual value of a higher priority progression aspect. Thus, for example, an independent progression which spans the progression aspects of resolution and spatial location, with resolution being given the higher priority, would iterate through all spatial locations at each resolution level. Independent progression priority schemes may be achieved by choosing appropriately larger weighting factors for the higher priority progression aspects. If the progression aspects are numbered from 1 to N, with 1 being the lowest priority progression aspect and N being the highest priority progression aspect, then an independent progression requires that the smallest weighted incremental change in priority value due to progression aspect K be larger than the changes in priority value due to full iteration through all lower priority progression aspects.

Consider a simple example where resolution is indexed with integer values from 1 to R, and spatial location is indexed with integer values from 1 to S, with resolution being given the higher priority. For this case, a weighting factor of 1 could be assigned for the location aspect. The full iteration through the location aspect would then produce a change in priority value of $1 \cdot (S-1) = S-1$. Accordingly, the smallest incremental change in priority value due to a change in resolution must be greater than $S-1$. This can be accomplished by choosing a weighting factor of S (or larger) for the resolution aspect. If the extension to the progression aspect of image planes (with three planes numbered 1 to 3) were then considered. The full iteration through the spatial location and resolution aspects would produce a change in priority value of $S \cdot (R-1) + S - 1 = S \cdot R - 1$, and the smallest incremental change in priority value due to a change in image plane must be greater than this change in priority value. This can be accomplished by choosing a weighting factor of $S \cdot R$ (or larger) for the resolution aspect. By using relatively smaller differences in the weighting factors, it is possible to come up with a range of progressions which are not independent (such as mixing of a spatial and resolution progression) may be determined. Such progressions would typically have the disadvantage that they would not sequence through the data in a systematic fashion.

As will be apparent to those skilled in the art, there are a variety of alternative methods by which sequencing of the bitblocks may be performed. For example, independent progression priority schemes may be simply implemented by means of nested processing loops. With this approach, the innermost processing loop iterates through the lowest priority progression aspect, while the successively external processing loops iterate through successively higher priority progression aspects. The outermost processing loop would thus iterate through the highest priority progression aspect.

Another alternative for sequencing of bitblocks would be to use bit allocation methods based on rate-distortion theory (as described in the article by Ortega and Ramchandran referenced above). However such an approach requires estimation of the rate-distortion slope for each bitblock, which would typically lead to relatively large computational requirements.

It will also be apparent that the bitblocks themselves may be further compressed by a variety of entropy coding methods such as arithmetic coding. With this approach, the property of preserving suffix field synchronization in the event of a corrupted bit value would be lost. To limit the effects of such loss of synchronization, it may be advisable to provide mechanisms for resynchronization at the start of each entropy-coded bitblock, so that a bit error within a given bitblock would not cause a loss of synchronization for all succeeding blocks.

As known to those skilled in the art, the bitblocks may be subdivided and indexed in accordance with additional considerations beyond those used here, such as by subband orientation. Accordingly, the progression considerations discussed here are given for the purposes of illustration and not limitation.

A variety of coding methods may be used to generate code words which may be separated into prefix and suffix portions, and are thus suitable for use within the framework of embodiments of the present invention. These include the Rice and start-step coding methods described above. Also, a Huffman coding or arithmetic coding method could be used in combination with constraints to produce suffix fields of length K to index superbins of width $2^K$ in accordance with the principles of the present invention.

It will be apparent to those skilled in the art that split field coding can be applied to data sets which are not characterized by a well-behaved distribution. This application can be accomplished by initially sorting the data set to produce a re-ordered monotonic distribution. This approach will result in error resilience in the sense that a bit error in the suffix field will not result in a loss of code word synchronization. However, the resulting error in the decoded value will not be constrained to a particular range since the sorting of the data set will destroy the contiguity of the superbins associated with specific prefix field values.

Variations of the codebook estimation methods for split field coding may be employed to enforce constraints on the suffix field length for a given set of code words, or similarly, to constrain the number of suffix bits from each of a given set of code words to be included within the bitblocks. Such constraints may be useful, for example, in providing uniform levels of embedding within a particular subset of the encoded data, such as within a given subband. Such constraints also may be useful to ensure that a certain proportion of the overall bitstream is resilient to errors, so that appropriate portions of the bitstream may be allocated to channels with higher or lower levels of error correction coding, or with higher or lower signal to noise ratios, as discussed below. A lower bound on the suffix field length may be achieved simply by enforcing a corresponding lower bound on the superbin width (i.e., on the Golomb parameter for Rice coding, or for the start parameter for start-step coding). An upper bound on the suffix field length (say with a maximum suffix length of N) may be effectively achieved without an actual change in the codebook estimation, but instead by simply separating only the N least significant suffix bits from the prefix. In that case, for a suffix of length M>N, the M−N most significant bits of the suffix would not be separated from the prefix, but would effectively be treated as part of the corresponding prefix.

Figure 10:
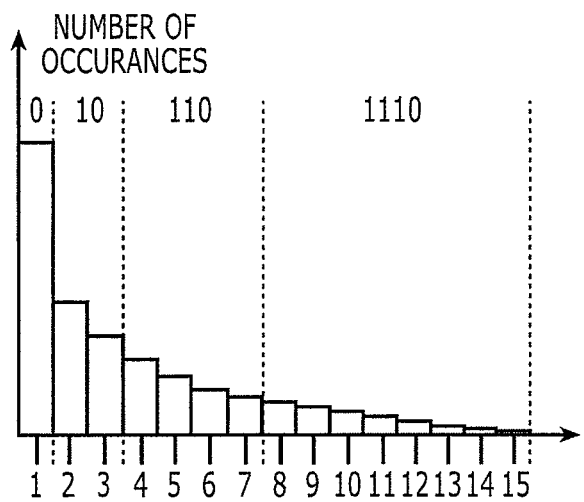
FIG. 10 is a histogram illustrating the relative frequency of occurrence of certain run lengths.

The same coding methods used to generate code words for split field coding (e.g., Rice coding or start-step coding) are suitable for encoding not only wavelet coefficients, but also run length codes, which as noted above can be effectively modeled using exponential distributions, such as the notional distribution shown in FIG. 10. Significance maps designate the positions of significant coefficients, i.e., coefficients which are non-zero after quantization. The significance maps may be first encoded as run lengths of consecutive occurrences of insignificant (i.e., zero) coefficients and significant coefficients. The run lengths may then be encoded using the same basic coding mechanisms used for split field coding, or with other known methods such as Huffman coding or arithmetic coding. Note, however, that errors in decoded run length values may result in misplacement of all coefficients whose positions are represented relative to that run length, resulting in considerable distortion in the reconstructed image. Thus, the error resilience properties of split field coding should generally not be used in conjunction with coding of run lengths.

Accordingly, the method and apparatus of certain embodiments of the present invention provide for error-resilient entropy coding which generates prefix and suffix portions of code words which can be suitably subdivided and aggregated to form packets or bitblocks which in turn can be sequenced to form a partially embedded bitstream, providing many of the benefits of progressive coding and fine grain scalability with modest computational cost. Due to the error resilience of the suffix portions of the code words and the absence of causality between packets derived from suffix portions of code word, the bitblocks may be flexibly sequenced to achieve a variety of progressive coding effects.

Due to the mechanisms of split field coding, once the prefix field of a code word is decoded correctly, then the effects of any errors in the decoding of the associated suffix field are constrained to a limited amount of distortion on the decoded value, without any loss of code word synchronization. Consequently, the prefix fields of code words should have higher priority and should be provided higher level of protection within the bitstream in comparison to the corresponding suffix fields.

One method for providing better protection of prefix fields is by placement within the bitstream using the methods described above for sequencing of bitblocks in accordance with a prescribed progression priority scheme. Later positions in the bitstream are subject to greater exposure to a wide variety of error effects, including termination of transmissions due to dropped packets, timeout, or user action; truncation of a bitstream to meet rate targets, application of Droptail buffering in routers, or various other limitations on storage and transmission channel bandwidth.

More elaborate error protection mechanisms may also be used to provide higher levels of protection to the prefix fields. One such approach is to apply varying levels of error correction coding (ECC) schemes with protection levels varying according to priority of content. This approach is one example of unequal error protection (UEP). Error correction coding adds redundancy to the encoded data, thus increasing storage and transmission requirements. Reducing the level of error correction correspondingly reduces the amount of redundancy. Accordingly, by providing a reduced level of error protection or no error protection to the suffix fields of the quantized coefficient code words, the storage and transmission requirements can be reduced by the method and apparatus of embodiments of the present invention while limiting the effects of bit errors incident upon the suffix fields of the quantized coefficient code words.

Another method for varying the level of error protection is to transmit different bitblocks using different channels of a quadrature amplitude modulation (QAM) constellation, with the different channels inherently subject to differing signal to noise ratios. This approach is also commonly called unequal error protection. Use of split field coding in conjunction with this strategy allows the suffix field data for the quantized coefficients to be transmitted over the lower quality channels of the QAM while limiting the resulting distortion in the reconstructed image.

Still another approach for providing differing levels of error protection is to apply different strategies for block retransmission in an Automatic Repeat-reQuest (ARQ) error control protocol, so that higher priority blocks are retransmitted upon errors, while lower priority blocks are not. With this method, the transmission of suffix field bitblocks within low priority blocks will increase channel throughput by eliminating block retransmissions for these blocks.

Figure 7A:
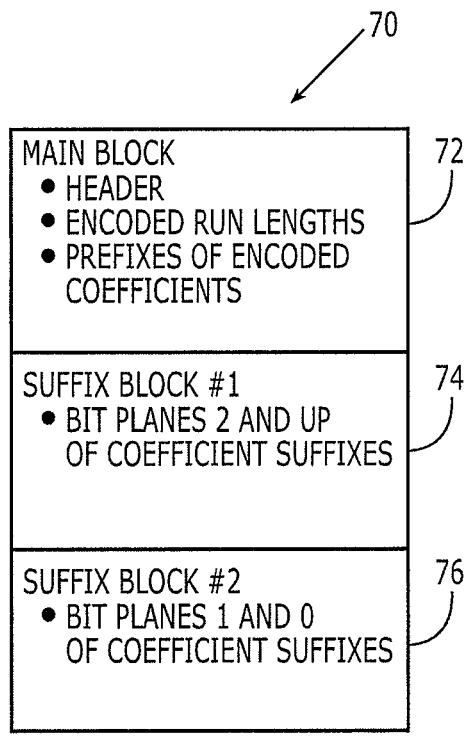
FIG. 7A illustrates a storage medium partitioned into a plurality of data blocks for storing, among other things, the prefix fields and the blocks including respective bitplanes drawn from the suffix fields and representing an intermediate level of embedding according to the method and apparatus of one embodiment of the present invention.

By way of a very simple example, FIG. 7A depicts the results of one embodiment which employs an intermediate level of embedding to generate a data structure 70 in which two blocks 74, 76 are defined, namely, suffix block 1 which includes bitplanes 2 and higher of the encoded suffixes and suffix block 2 which includes bit planes 1 and 0 of the encoded suffixes. For simplicity, this example demonstrates only the quality progression aspect. As will be noted, the significance of the bits of the encoded suffixes increases with their number such that bitplane two is of more significance than bitplane zero. The two suffix blocks are then arranged to follow the main block 72 which, in turn, includes a header, the entropy coded run-length information and the prefixes of the encoded coefficients.

While differing levels of error correction coding could be applied to the main block 72 and to the suffix blocks 74 and 76, with lower levels of correction provided to the later blocks, the mere ordering of the main block for initial transmission followed by the transmission of suffix block 1 and, in turn, suffix block 2 provides more protection for the earlier blocks with the likelihood of successful transmission of the main block exceeding that of suffix block 1 and the likelihood of success of the successful transmission of suffix block 1 exceeding that of suffix block 2. Still further, suffix block 2 may be simply truncated in some embodiments such that the main block and suffix block 1 have more protection from errors due to their earlier placement within the bitstream, regardless of whether additional error protection measures are taken.

Figure 7B:
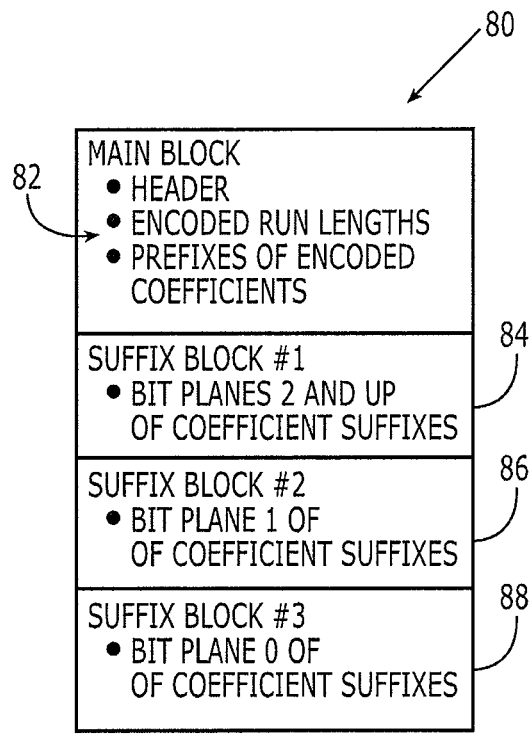
FIG. 7B illustrates a storage medium partitioned into a plurality of data blocks for storing, among other things, the prefix fields and the blocks including respective bitplanes drawn from the suffix fields and representing a finer level of embedding according to the method and apparatus of another embodiment of the present invention.

By way of comparison, FIG. 7B illustrates another example of a data structure 80, albeit, this time with a more fine degree of embedding. In this embodiment, three blocks 84, 86, 88 are defined, namely, suffix block 1 which includes bitplanes 2 and higher of the encoded suffixes, suffix block 2 which includes bitplane 1 of the encoded suffixes and suffix block 3 which includes bitplane 0 of the encoded suffixes. The three suffix blocks may be ordered as shown in FIG. 7B and then arranged to follow the main block 82, as described above. By controlling the number of bitplanes that are encoded in each block the coarseness of the embedded code can be defined.

Following the data compression process described above, the encoded data, such as data structures 70, 80 depicted in FIGS. 7A and 7B, can be efficiently stored, such as by a storage medium 18. If desired, the main block and the various suffix blocks can be stored in different portions of the storage medium that afford different levels of error correction coding. In this regard, the encoded data may be stored such that the earlier blocks are afforded higher levels of error correction coding than later blocks. As noted above, truncation of the bitstream to meet a bit rate target or to satisfy storage constraints will expose the later blocks to higher levels of errors. Thus, varying levels of error protection may result simply from sequence of placement with the bitstream, or from the more elaborate methods with varied levels of error correction coding.

Likewise, the compressed and encoded data can be efficiently transmitted, such as via first and second data links. In particular, the error resilient method and apparatus of certain embodiments of the present invention can include a transmitter 20 which transmits the respective run length code words and the prefix fields of the quantized coefficient code words via a first data link 22 which has relatively higher signal to noise ratio and an accordingly lower incidence of error, and which transmits the suffix blocks of the quantized coefficient code words via respective data links with at least the suffix block that includes the least significant bitplane being transmitted, if at all, via a second data link 24 which has relatively lower signal to noise ratio and an accordingly higher incidence of error. In the embodiment in which one or more of the suffix blocks are transmitted via the second data link, the suffix blocks provide error resilience such that the higher incidence of errors in the second data link will result in very limited distortion within the reconstructed image.

In instances in which one or more suffix blocks are truncated, it is advisable for the data encoder 16 to indicate or flag the end of the compressed data so that the decoder knows which bits have been truncated. In this embodiment, the decoder can then substitute zero bits for the suffix bits which have been truncated, assuming that the suffix code is constructed so that a suffix of zero represents the smallest magnitude in each superbin. Since the distributions of wavelet coefficients are sharply peaked toward zero, this technique can serve to reduce the quantization error due to the truncated bits. By separately providing the prefix fields to the decoder, the decoder can maintain synchronization even in the event of the truncation of one or more of the suffix blocks and can readily determine the superbin to which the truncated suffix blocks relate, thereby limiting the degradation in the resulting data.

Figure 8:
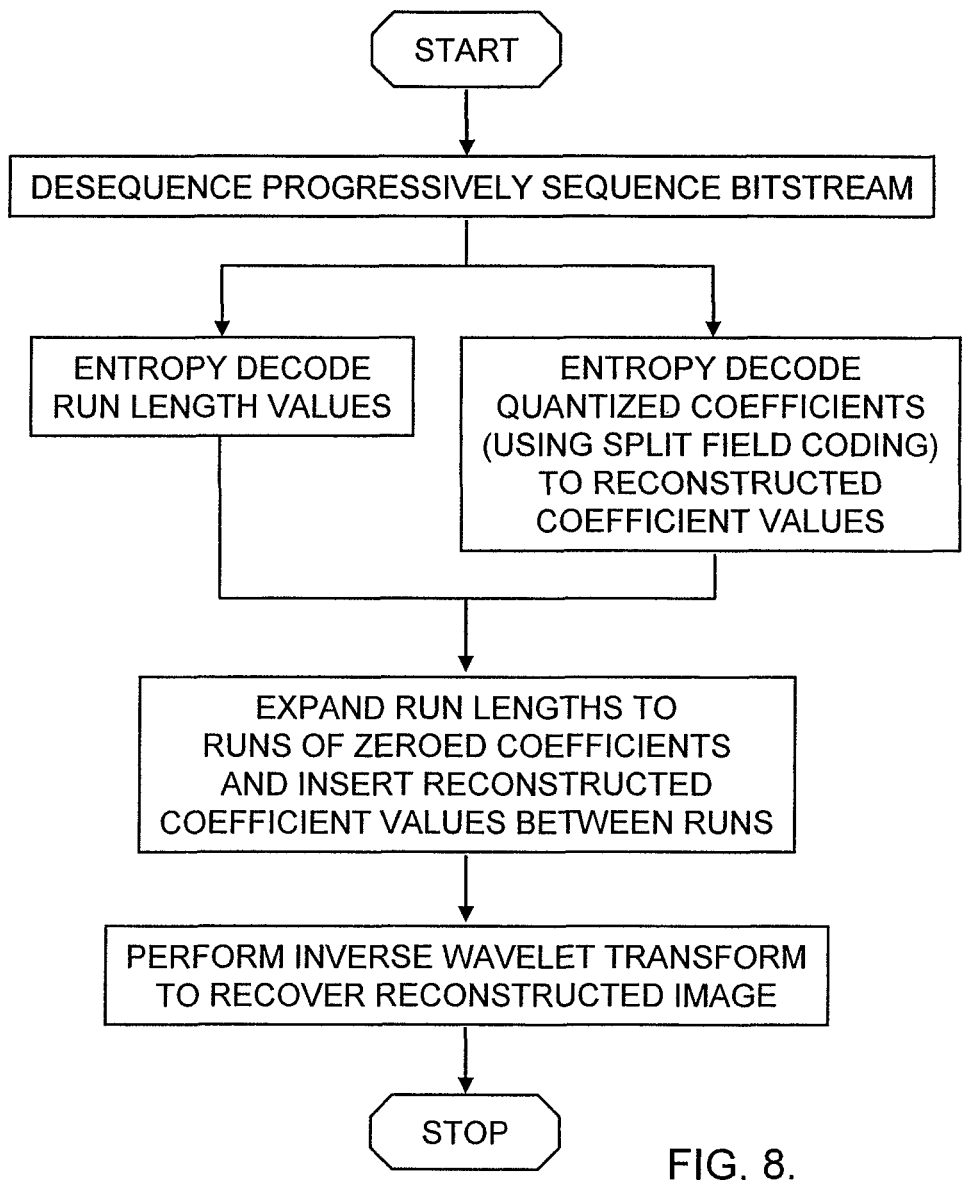
FIG. 8 is a flow chart illustrating operations for decompressing data which has been encoded according to one embodiment of the present invention.

Upon reception and desequencing of the compressed data, the prefix fields of the quantized coefficient code words can be decoded (as shown in FIG. 8) and the lengths of the suffix fields can be determined based on the decoded prefix fields. If one or more bit errors are incident upon the suffix field of a quantized coefficient code word, the code word synchronization is not lost because the length of the suffix field is known. As a result, the resulting error in the decoded coefficient value will be constrained to the range of coefficient values for the superbin corresponding to the associated prefix field. Accordingly, the effects of the error on the reconstructed image will be limited and will not be catastrophic. Following the transmission of the encoded data and the possible detection and correction of any storage and transmission errors by means of channel decoding, the compressed data, including both the quantized values for the significant coefficients and the relative positions of the significant coefficients, is decoded and dequantized with the reconstructed coefficient values being inserted between runs of zeroed coefficients. A reconstructed image based upon the original image can then be recovered as shown in FIG. 8 by performing an inverse transformation, such as an inverse wavelet transformation.

The error resilient method and apparatus for compressing data, including the data transformer 12, the data quantizer 14, the data encoder 16 and the progression priority sequencing 29, may be implemented by a combination of hardware and software. For example, the method and apparatus for compressing data, including the data encoding means and its constituent elements, can be implemented by a processor, such as a server, a workstation or other computing device, which operates under the control of a computer program product to provide the data transformation, quantization and encoding processes described above. In turn, the computer program product for performing the methods of embodiments of the present invention includes a computer-readable storage medium and computer-readable program code portions, such as a series of computer instructions, embodied in the computer-readable storage medium.

In this regard, FIGS. 2, 4 and 8 are flowcharts of methods, apparatus and program products according to certain embodiments of the present invention. It will be understood that each block or step of the flowchart, and combinations of blocks in the flowchart, can be implemented by computer program instructions. These computer program instructions may be loaded onto a computer or other programmable apparatus, such as the aforementioned processor, to produce a machine, such that the instructions which execute on the computer or other programmable apparatus create means for implementing the functions specified in the flowchart block(s) or step(s). These computer program instructions may also be stored in a computer-readable memory that can direct a computer or other programmable apparatus to function in a particular manner, such that the instructions stored in the computer-readable memory produce an article of manufacture including instruction means which implement the function specified in the flowchart block(s) or step(s). The computer program instructions may also be loaded onto a computer or other programmable apparatus to cause a series of operational steps to be performed on the computer or other programmable apparatus to produce a computer implemented process such that the instructions which execute on the computer or other programmable apparatus provide steps for implementing the functions specified in the flowchart block(s) or step(s).

Accordingly, blocks or steps of the flowchart support combinations of means for performing the specified functions, combinations of steps for performing the specified functions and program instruction means for performing the specified functions. It will also be understood that each block or step of the flowchart, and combinations of blocks or steps in the flowchart, can be implemented by special purpose hardware-based computer systems which perform the specified functions or steps, or combinations of special purpose hardware and computer instructions.

Many modifications and other embodiments of the inventions set forth herein will come to mind to one skilled in the art to which these inventions pertain having the benefit of the teachings presented in the foregoing descriptions and the associated drawings. Therefore, it is to be understood, that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. An error-resilient method of encoding or decoding data into a compressed bitstream comprising:
generating, with a processor, data values to be encoded with a plurality of code words or receiving, with the processor, data values to be decoded with a plurality of code words, wherein the plurality of code words include code words having first and second portions with each first portion including information that is representative of a predetermined characteristic of an associated second portion and with each second portion including information that is representative of a respective portion of the data, and wherein the second portions of the code words are arranged into a plurality of bitblocks with each bitblock including one or more bitplanes of the second portions of the code words.

2. A method according to claim 1 further comprising the step of associating relative progression priorities to the individual bitblocks in accordance with a significance of the bitplanes within the bitblocks, with bitblocks having higher significance bitplanes being associated to higher progression priorities.

3. A method according to claim 2, further comprising the step of providing bitblocks with protection from errors by means of placement within the bitstream, with bitblocks placed sequentially within the bitstream in accordance with relative progression priorities, such that bitblocks having higher progression priorities are placed earlier within the bitstream, wherein bitblocks placed earlier in the bitstream are provided greater protection from errors whose incidence increases for later positions within the bitstream.

4. A method according to claim 2, further comprising the step of providing bitblocks with protection from errors by means of error correction coding applied to at least one bitblock, such that the level of error correction coding provided to at least one bitblock is greater than any error correction coding provided to bitblocks having lower relative progression priorities.

5. A method according to claim 2, further comprising the step of providing bitblocks with differing levels of protection from errors by means of transmission over channels subject to differing expected levels of signal to noise ratio, such that at least one bitblock is transmitted over a channel having a higher expected signal to noise ratio than the channel(s) used for transmission of bitblocks having lower relative progression priorities.

6. A method according to claim 2, further comprising the step of providing bitblocks with differing levels of protection from errors by means of differing strategies for block retransmission in an Automatic Repeat-reQuest (ARQ) error control protocol, with at least one block containing bitblocks having higher relative progression priorities retransmitted upon errors, but with blocks containing bitblocks having lower relative progression priorities not retransmitted upon errors.

7. A method according to claim 1 further comprising defining each bitblock to include a different bitplane that is not included in any other bitblock.

8. A method according to claim 1 wherein generating or receiving data values with a plurality of code words comprises employing code words having first and second portions with each first portion including information that is representative of the set of data values representable by an associated second portion, and with each second portion uniquely including information that is representative of the encoded data value within the set of data values designated by the associated first portion.

9. A method according to claim 8 wherein the number of data values in the set designated by the first portion of each code word is equal to $2^K$, where K is an integer greater than or equal to zero, with each associated second portion comprised of code symbols, with the number of code symbols forming the associated second portion equal Ito K, and with the code symbols of the associated second portion collectively defining a code value which uniquely includes information that is representative of the encoded data value from among the set of $2^K$ data values designated by the first portion of the code word.

10. A method according to claim 8 wherein the first portion of each code word contains information representative of a consecutive range of data values representable by an associated second portion, and wherein each associated second portion is comprised of code symbols which collectively define a code value from among a range of possible code values, for which the range of possible code values defines an ordinal one-to-one mapping to the consecutive range of data values designated by the first portion of the code word.

11. A method according to claim 8, further comprising sorting a distribution of estimated probabilities or frequencies of occurrence for the data values to be encoded to produce a monotonically non-ascending distribution of probabilities or frequencies of occurrence, with the data values to be encoded associated to the placement of the corresponding probability or frequency value within the sorted distribution,
   wherein the sorting of the probability or frequency distribution is performed in a forward adaptive or backward adaptive fashion,
   wherein the compressed bitstream includes information representative of any forward adaptive sorting of the probability or frequency distribution, and
   wherein representing data values with a plurality of code words comprises associating the plurality of code words to the data values as ordered within the sorted probability or frequency distribution.

12. A method according to claim 1, further comprising employing transformation and quantization of the data prior to encoding or after decoding the data, wherein transformation of the data comprises representing the data as a weighted sum of predetermined basis functions and wherein quantization of the transformed data comprises representing the transformed data such that the quantized data has an equal or smaller number of unique coefficient values than the transformed data, and wherein representing data values with a plurality of code words comprises associating the plurality of code words to the transformed and quantized data.

13. A method according to claim 12, further comprising the step of subdividing each bitblock and the first portions of associated code words into a plurality of bitblocks with one or more subdivisions applied over the range of each of one or more aspects of the associated transformed data, with said aspects selected from the group consisting of spatial, temporal, or other independent coordinates of the data as defined by spatial, temporal, or other subdivision of the data; resolution or frequency coordinates of the transformed data as defined by the predetermined transformation basis functions; orientation of transform subbands as defined by the predetermined transformation basis functions; image plane among one or more image planes separated along color, spectral, temporal, or other independent coordinate(s), and significance of the bitplanes for the second portions of code words.

14. A method according to claim 13, wherein the individual bitblocks resulting from said subdividing step are each associated to an index comprised of one or more elements, with each element of the index associated with a corresponding bitblock aspect according to which the bitblocks have been subdivided,
   wherein each element of the bitblock index is associated to a range of numeric values which vary in accordance with a relative priority of progression defined over a domain of the corresponding bitblock aspect, with higher values signifying higher progression priority, and
   wherein each bitblock which contains the first portions of code words is associated to a significance index element having a higher relative priority value than the significance index elements associated to the corresponding bitblocks which contain bitplanes from the second portions of the same code words and which otherwise share the same coordinates within the domains of the bitblock aspects.

15. A method according to claim 14, wherein relative priority values for the significance index elements are associatable to a quality weighting factor which is defined in accordance with a predetermined distortion measure used to measure distortion between original and reconstructed data sets, with said quality weighting factor being monotonically related to an estimate of a change in a value for the predetermined distortion measure due to an error on a single bit of a bitplane represented within the bitblock, and
   wherein the predetermined distortion measure is additionally weighted along one or more of the bitblock aspects, to support selective variation of the relative priority for subsets of the data in a prescribed fashion in accordance with factors selected from the group consisting of human perceptual considerations, quantitative distortion considerations, spatial, spectral or temporal filtering considerations, selective emphasis or region of interest considerations, considerations of the utility of the reconstructed data for specific applications, and an intended reversal of the relative progression priority along one or more of the bitblock aspects.

16. A method according to claim 15, wherein relative progression priorities for the individual bitblocks, prioritized with respect to bitblock aspects, are defined by an assignment of relative priorities to the individual aspects, ranging from the highest priority bitblock aspect to the lowest priority bitblock aspect,
   wherein the relative progression priorities for the bitblocks are specified in accordance with a sort order which would be obtained by iteration of a series of nested loops which iterate over relative priority values of the index elements for the respective bitblock aspects, with the outermost loop iterating over the relative priority values of the index elements for the highest priority bitblock aspect, with successively internal loops iterating over the relative priority values of the index elements for successively lower priority bitblock aspects, and with the innermost loop iterating over the relative priority values of the index elements for the lowest priority bitblock aspect,
   wherein a looped iteration over the relative priority values of the index elements for a bitblock aspect comprises iterating from the highest relative priority value to the lowest relative priority value of the index elements for the bitblock aspect associated with the current loop, while the relative priority values of the index elements for the higher priority bitblock aspects associated with the loops which are relatively external to the current loop remain fixed in accordance with the current iteration state of those relatively external loops, with the said relative priority values including any applicable weighting, and
   wherein the relative progression priorities for individual bitblocks are specified in accordance with the iteration of the innermost loop, with successive iterations of the innermost loop specifying bitblocks with successively lower progression priorities, with each iteration of the innermost loop specifying the bitblock associated to the index for which the relative priority values of the index elements correspond to the current iteration state of the series of nested loops.

17. A method according to claim 15, wherein relative progression priorities for the individual bitblocks, prioritized with respect to bitblock aspects, are defined by an assignment of numeric weighting factors to each of the individual aspects, with the lowest priority progression aspect being assigned the smallest aspect weighting factor, with higher priority progression aspects being assigned correspondingly larger aspect weighting factors, and with the highest priority progression aspect being assigned the largest aspect weighting factor, wherein a relative progression priority for each bitblock is computed as a weighted sum of the relative priority values of the index elements for the applicable bitblock aspects, each relative priority value multiplied by the aspect weighting factor for the respective bitblock aspect.

18. An apparatus for encoding or decoding data into a compressed bitstream comprising:

a processor configured to represent data values to be encoded or decoded with a plurality of code words, wherein the plurality of code words include code words having first and second portions with each first portion including information that is representative of a predetermined characteristic of an associated second portion and with each second portion including information that is representative of a respective portion of the data, and wherein the second portions of the code words are arranged into a plurality of bitblocks with each bitblock including one or more bitplanes of the second portions of the code words.

19. An apparatus according to claim 18 wherein the processor is further configured to associate relative progression priorities to the individual bitblocks in accordance with a significance of the bitplanes within the bitblocks, with bitblocks having higher significance bitplanes being associated to higher progression priorities.

20. A computer program product comprising at least one non-transitory computer-readable storage medium having computer-readable program instructions stored therein, the computer-readable program instructions comprising:

program instructions configured to represent data values to be encoded or decoded with a plurality of code words, wherein the plurality of code words include code words having first and second portions with each first portion including information that is representative of a predetermined characteristic of an associated second portion and with each second portion including information that is representative of a respective portion of the data, and wherein the second portions of the code words are arranged into a plurality of bitblocks with each bitblock including one or more bitplanes of the second portions of the code words.

* * * * *